(12) United States Patent
Lee et al.

(10) Patent No.: US 11,670,679 B2
(45) Date of Patent: Jun. 6, 2023

(54) SEMICONDUCTOR DEVICES

(71) Applicant: SAMSUNG ELECTRONICS CO., LTD., Suwon-si (KR)

(72) Inventors: Kyunghwan Lee, Seoul (KR); Yongseok Kim, Suwon-si (KR); Hyuncheol Kim, Seoul (KR); Sungwon Yoo, Hwaseong-si (KR); Jaeho Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

(21) Appl. No.: 17/225,716

(22) Filed: Apr. 8, 2021

(65) Prior Publication Data
US 2022/0028975 A1    Jan. 27, 2022

(30) Foreign Application Priority Data

Jul. 23, 2020    (KR) .................. 10-2020-0091624

(51) Int. Cl.
| | | |
|---|---|---|
| H01L 29/00 | (2006.01) | |
| H01L 29/10 | (2006.01) | |
| H01L 29/786 | (2006.01) | |
| H01L 29/06 | (2006.01) | |

(52) U.S. Cl.
CPC ...... *H01L 29/1033* (2013.01); *H01L 29/0615* (2013.01); *H01L 29/7869* (2013.01); *H01L 29/78642* (2013.01)

(58) Field of Classification Search
CPC ......... H01L 29/78642; H01L 29/41733; H01L 29/7869; H01L 29/78696; H01L 29/0615; H01L 29/1033
See application file for complete search history.

(56) References Cited

U.S. PATENT DOCUMENTS

| | | | |
|---|---|---|---|
| 9,209,092 B2 | 12/2015 | Yamazaki et al. | |
| 9,287,294 B2 | 3/2016 | Yamazaki | |
| 9,748,273 B2 | 8/2017 | Yamazaki et al. | |
| 10,204,941 B2 | 2/2019 | Wang | |
| 10,249,654 B1 | 4/2019 | Zhou et al. | |
| 10,516,061 B2 | 12/2019 | Yeh et al. | |
| 10,707,322 B2* | 7/2020 | Chen | H01L 23/291 |
| 11,282,963 B2* | 3/2022 | Ahmed | H01L 29/7869 |
| 2019/0164985 A1 | 5/2019 | Lee et al. | |
| 2019/0198675 A1 | 6/2019 | Sharma et al. | |
| 2020/0035837 A1 | 1/2020 | Ahmed | |
| 2020/0127116 A1* | 4/2020 | Chen | H01L 21/0254 |

* cited by examiner

*Primary Examiner* — Nikolay K Yushin
(74) *Attorney, Agent, or Firm* — Sughrue Mion, PLLC

(57) ABSTRACT

A semiconductor device includes a gate electrode on a substrate, a channel surrounding sidewalls of the gate electrode on the substrate, and source/drain electrodes on the substrate at opposite sides of the gate electrode in a first direction parallel to an upper surface of the substrate. A thickness of the channel from the gate electrode to the source/drain electrodes in a horizontal direction parallel to the upper surface of the substrate is not constant but varies in a vertical direction perpendicular to the upper surface of the substrate.

19 Claims, 28 Drawing Sheets

SEMICONDUCTOR DEVICES

CROSS-REFERENCE TO RELATED APPLICATION

This application claims priority under 35 USC § 119 to Korean Patent Application No. 10-2020-0091624, filed on Jul. 23, 2020 in the Korean Intellectual Property Office (KIPO), the entire contents of which are herein incorporated by reference in their entirety.

BACKGROUND

1. Field

Example embodiments relate to a semiconductor device. More particularly, example embodiments relate a semiconductor device having a channel including an oxide semiconductor.

2. Description of the Related Art

In a related art transistor having a channel including an oxide semiconductor, source/drain electrodes are formed on the channel, and a gate electrode is formed between the source/drain electrodes. Since impurities may not be doped into the channel, the on-current may decrease and the swing characteristics may be deteriorated, as the distance between the source electrode and the drain electrode increases. If the distance between the source electrode and the drain electrode decreases, the parasitic capacitance between the source/drain electrodes and the gate electrode increases, and an insulation layer therebetween may be broken by a breakdown voltage.

SUMMARY

Example embodiments provide a semiconductor device having good characteristics.

According to example embodiments, there is provided a semiconductor device. The semiconductor device may include a gate electrode on a substrate, a channel surrounding sidewalls of the gate electrode on the substrate, and source/drain electrodes on the substrate at opposite sides of the gate electrode in a first direction parallel to an upper surface of the substrate. A thickness of the channel from the gate electrode to the source/drain electrodes in a horizontal direction parallel to the upper surface of the substrate may not be constant but vary in a vertical direction perpendicular to the upper surface of the substrate.

According to example embodiments, there is provided a semiconductor device. The semiconductor device may include a gate electrode on a substrate, a channel surrounding sidewalls of the gate electrode on the substrate, and source/drain electrodes on the substrate at opposite sides of the gate electrode in a first direction parallel to an upper surface of the substrate. A distance in the first direction between the gate electrode and each of the source/chain electrodes may not be constant but vary in a vertical direction perpendicular to the upper surface of the substrate.

According to example embodiments, there is provided a semiconductor device. The semiconductor device may include a gate electrode on a substrate, a channel surrounding sidewalls of the gate electrode on the substrate, source/drain electrodes on the substrate at opposite sides of the gate electrode in a first direction parallel to an upper surface of the substrate, a first contact plug on the gate electrode, second and third contact plugs on the source/drain electrodes, respectively, and first to third wirings contacting upper surfaces of the first to third contact plugs, respectively. A thickness of the channel in a horizontal direction parallel to the upper surface of the substrate may not be constant but vary in a vertical direction perpendicular to the upper surface of the substrate, and a thickness of each of the source/drain electrodes in the horizontal direction may not be constant but vary in the vertical direction. A distance in the horizontal direction between the first contact plug and each of the second and third contact plugs may be greater than a minimum distance in the horizontal direction between the gate electrode and each of the source/drain electrodes.

DETAILED DESCRIPTION

Figure 1:
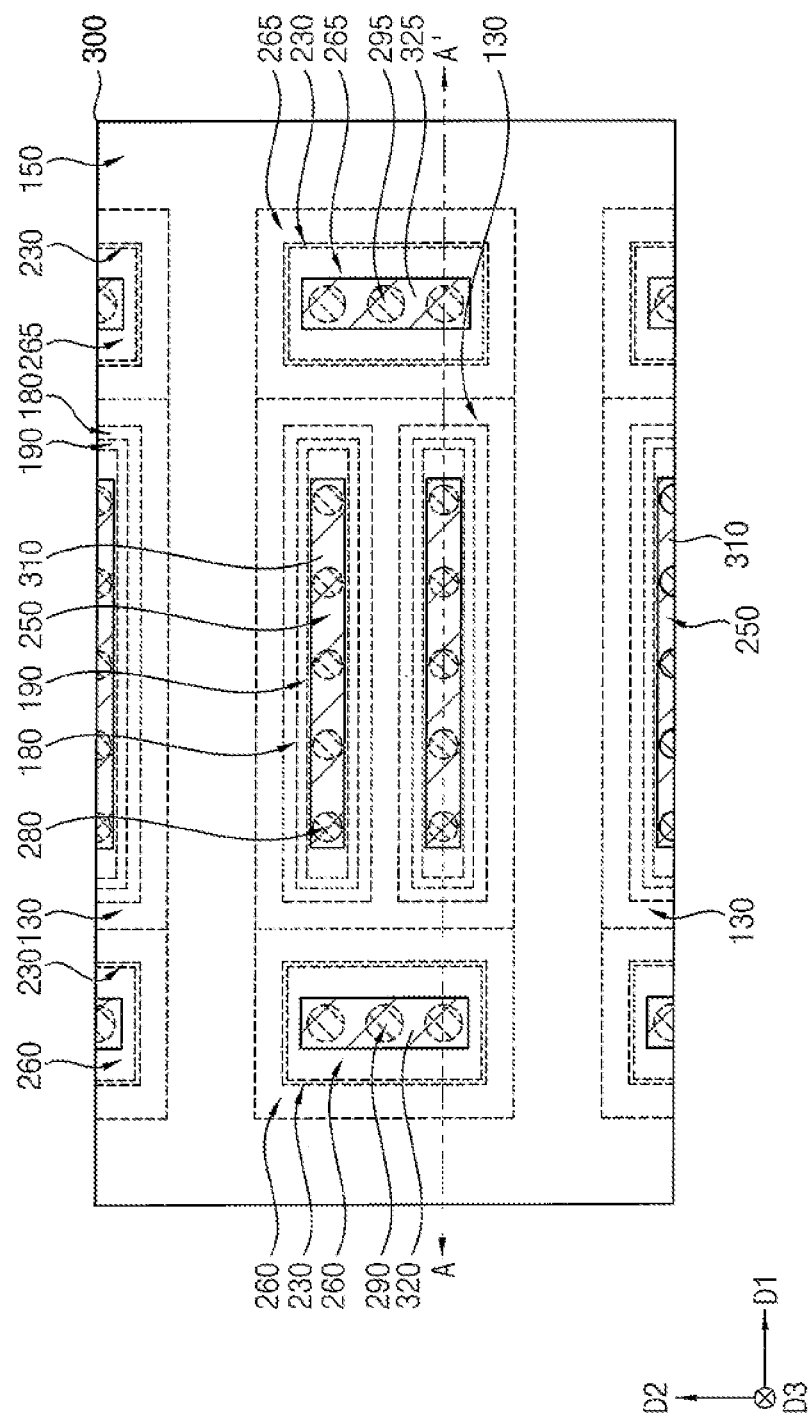
FIGS. 1 and 2 are a plan view and a cross-sectional view, respectively, illustrating a semiconductor device in accordance with example embodiments.

Example embodiments will be more clearly understood from the following detailed description taken in conjunction with the accompanying drawings, in which like reference numerals refer to like elements throughout.

Figure 2:
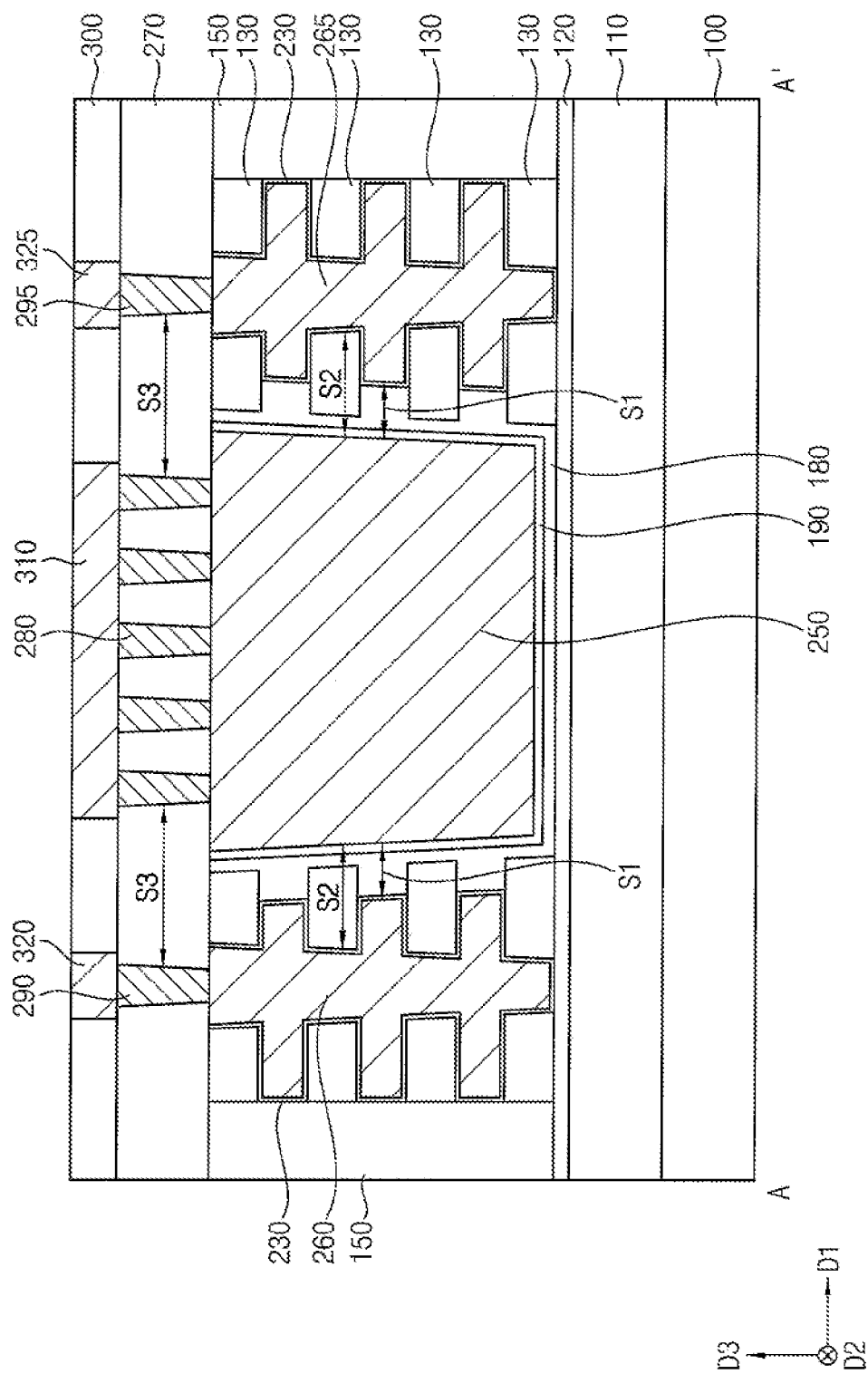

FIGS. 1 and 2 are a plan view and a cross-sectional view, respectively, illustrating a semiconductor device in accordance with example embodiments. FIG. 1 is the plan view, and FIG. 2 is a cross-sectional view taken along a line A-A' in FIG. 1.

Hereinafter, in the specification (but not necessarily in the claims), two directions substantially parallel to an upper surface of a substrate and crossing each other may be defined as a first direction D1 and a second direction D2, respectively, and a direction substantially perpendicular to the upper surface of the substrate may be defined as a third direction D3. In some example embodiments, the first and second directions D1 and D2 may be substantially perpendicular to each other.

Referring to FIGS. 1 and 2, the semiconductor device may include a gate electrode 250 on a substrate 100, a channel 180 surrounding a sidewall of the gate electrode 250, source/drain electrodes 260 and 265 at opposite sides, respectively, in the first direction D1, of the gate electrode 250 on the substrate 100, a first contact plug 280 on the gate electrode 250, a second contact plug 290 and a third contact plug 295 on the source/drain electrodes 260 and 265, respectively, and a first wiring 310, a second wiring 320, and a third wiring 325 contacting upper surfaces of the first to third contact plugs 280, 290 and 295, respectively.

The semiconductor device may further include a pad layer 110, an etch stop layer 120, an insulation layer 130, a division layer 150, a gate insulation pattern 190 and a barrier pattern 230.

The substrate 100 may include a semiconductor material, e.g., silicon, germanium, silicon-germanium, etc., or III-V semiconductor compounds, e.g., GaP, GaAs, GaSb, etc.

The pad layer 110 and the etch stop layer 120 may be sequentially stacked on the substrate 100. The pad layer 110 may include an oxide, e.g., silicon oxide, and the etch stop layer 120 may include a metal oxide, e.g., aluminum oxide.

In some example embodiments, the gate electrode 250 may extend in the first direction D1 between the source/drain electrodes 260 and 265 that are spaced apart from each other in the first direction D1, and a plurality of gate electrodes 250 may be spaced apart from each other in the second direction D2. In the example embodiment illustrated in FIG. 1, two electrodes 250 between the source/drain electrodes 260 and 265 are shown. However, the inventive concept is not limited thereto, and in some embodiments, only one gate electrode 250 may be formed between the source/drain electrodes 260 and 265.

The gate electrode 250 may include a metal, e.g., tungsten, copper, aluminum, titanium, tantalum, etc.

A sidewall and a lower surface of the gate electrode 250 may be covered by the gate insulation pattern 190. The gate insulation pattern 190 may include an oxide, e.g., silicon oxide.

The channel 180 may cover a sidewall and a lower surface of the gate insulation pattern 190 that covers the sidewall and the lower surface of the gate electrode 250, and thus the channel 180 may surround the sidewall of the gate electrode 250. In some example embodiments, the channel 180 may cover the sidewalls and the lower surface of the gate insulation pattern 190 that, in turn covers the sidewalls and the lower surface of the gate electrode 250, such that the channel 180 may surround the sidewalls of the gate electrode 250 with the gate insulation pattern 190 therebetween.

In example embodiments, the channel 180 may have a thickness in the first direction D1, that is, the horizontal direction that may not be constant but may change in the third direction D3, that is, in the vertical direction. Unlike an inner sidewall of the channel 180 contacting the gate insulation pattern 190, an outer sidewall of the channel 180 not contacting the gate insulation pattern 190 may not be even or flat, but may have a protrusion and a recess in the third direction, as best seen FIG. 2. In some example embodiments, the channel 180 may have a first portion having a relatively large thickness in the first direction D1 (i.e., the horizontal direction) and a second portion having a relatively small thickness in the first direction D1, and the first and second portions may be alternately and repeatedly stacked in the third direction D3, as illustrated in FIG. 2. The second portion of the channel 180 may contact a sidewall of the insulation layer 130.

In some example embodiments, the channels 180 that surround the sidewalls of the gate electrodes 250 which are spaced apart from each other in the second direction D2 between the source/drain electrodes 260 and 265 which are spaced apart from each other in the first direction D1 may be connected with each other. That is, in some example embodiments, the channels 180 of the gate electrodes 250 in the center of FIG. 1 may be connected with each other. However, the inventive concept is not limited thereto, and the channels 180 surrounding the sidewalls of the gate electrodes 250, respectively, may not be connected with each other but rather may be spaced apart from each other. In this case, a portion of a first sacrificial layer 140 including a nitride, e.g., silicon nitride (refer to FIGS. 9 and 10) may remain between the first portions of the channels 180.

In example embodiments, the channel 180 may include an oxide semiconductor. The oxide semiconductor may include, e.g., barium tin oxide ($BaSnO_3$), zinc oxide (ZnO), laminated lanthanum aluminate/strontium titanate ($LaAlO_3$/$SrTiO_3$), gallium oxide ($Ga_2O_3$), tin oxide ($SnO_2$), indium oxide ($In_2O_3$), indium gallium zinc oxide (IGZO), indium zinc tin oxide (IZTO), indium tin oxide (ITO), indium tungsten tin oxide (IWZO), and/or indium zinc oxide (IZO).

However, the inventive concept is not limited thereto, and the channel 180 may include other materials, e.g., amorphous silicon, polysilicon, single crystalline silicon, silicon-germanium, etc. In other example embodiments, the channel 180 may include a two-dimensional material, e.g., carbon nanotube (CNT), or a transition metal dichalcogenide (TMDC), e.g., molybdenum ditelluride ($MoTe_2$), molybdenum disulfide ($MoS_2$), etc.

Each of the source/drain electrodes 260 and 265 may include a vertical portion extending in the third direction D3 and a horizontal portion extending in the first direction D1 as illustrated in the example of FIG. 2. In example embodiments, a plurality of horizontal portions may be spaced apart from each other in the third direction D3, and thus a width in the horizontal direction of each of the source/drain electrodes 260 and 265 may periodically change in the third direction D3.

In example embodiments, the first portion of the channel 180 may face the horizontal portion of each of the source/drain electrodes 260 and 265 in the first direction D1, and the second portion of the channel 180 may face the vertical direction of each of the source/drain electrodes 260 and 265 in the first direction D1. The insulation layer 130 may be interposed between the second portion of the channel 180 and the vertical portion of each of the source/drain electrodes 260 and 265.

In example embodiments, a first distance S1 between a sidewall of the horizontal portion of each of the source/drain electrodes 260 and 265 facing the first portion of the channel 180 and a sidewall of the gate electrode 250 may be less than a second distance S2 between a sidewall of the vertical portion of each of the source/drain electrodes 260 and 265 facing the second portion of the channel 180 and the sidewall of the gate electrode 250. That is, even though the first portion of the channel 180 that surrounds the sidewall of the gate electrode 250 has a thickness greater than the second portion thereof, the horizontal portion of each of the source/drain electrodes 260 and 265 that faces the first portion of the channel 180 may have a width greater than that of the vertical portion of each of the source/drain electrodes 260 and 265 that faces the second portion of the channel 180, and thus a distance from the horizontal portion of each of the source/drain electrodes 260 and 265 to the gate electrode 250 may be less than a distance from the vertical portion of each of the source/drain electrodes 260 and 265 to the gate electrode 250.

Accordingly, a distance in the first direction D1 between the gate electrode 250 and each of the source/drain electrodes 260 and 265 may not be constant but change in the third direction D3. Particularly, the first and second portions of the channel 180 may be alternately and repeatedly disposed in the third direction D3 and the horizontal and vertical portions of each of the source/drain electrodes 260 and 265 may be alternately and repeatedly disposed in the third direction D3, and thus the distance in the first direction D1 between the gate electrode 250 and each of the source/drain electrodes 260 and 265 may be periodically changed in the first direction D1.

In example embodiments, one of the source/drain electrodes 260 and 265 at opposite sides, respectively, in the first direction D1 of the gate electrode 250 may serve as a source electrode, and the other one thereof may serve as a drain electrode. Each of the source/drain electrodes 260 and 265 may include a metal, e.g., tungsten, copper, aluminum, titanium, tantalum, etc.

The barrier pattern 230 may cover a sidewall and a lower surface of each of the source/drain electrodes 260 and 265. In some example embodiments, the barrier pattern 230 may cover sidewalls and the lower surface of each of the source/drain electrodes 260 and 265. Thus, the barrier pattern 230 covering a sidewall of the horizontal portion of each of the source/drain electrodes 260 and 265 may contact a sidewall of the first portion of the channel 180. The barrier pattern 230 may include a metal nitride, e.g., titanium nitride, tantalum nitride, tungsten nitride, etc., or a metal, e.g., titanium, tantalum, etc.

Each of the source/drain electrodes 260 and 265 and the barrier pattern 230 may form a source/drain electrode structure.

A plurality of insulation layers 130 may be formed at a plurality of levels, respectively, spaced apart from each other in the third direction D3, and may be interposed between the second portion of the channel 180 and the vertical portion of each of the source/drain electrodes 260 and 265. The insulation layer 130 may include an oxide, e.g., silicon oxide.

The division layer 150 may be formed on the etch stop layer 120, and may divide structures each of which may include the gate electrode 250, the gate insulation pattern 190, the channel 180, the source/drain electrodes 260 and 265, the barrier pattern 230 and the insulation layer 130. Thus, a plurality of structures may be spaced apart from each other in each of the first and second directions D1 and D2. The division layer 150 may include an oxide, e.g., silicon oxide, and thus in some example embodiments may be merged with the insulation layer 130.

In some example embodiments, a plurality of first contact plugs 280 may be spaced apart from each other in the first direction D1 on the gate electrode 250. However, the inventive concept is not limited thereto. In some example embodiments, only one first contact plug 280 may be on the gate electrode 250. Additionally, a plurality of second contact plugs 290 may be spaced apart from each other in the second direction D2 on the source/drain electrode 260, and a plurality of third contact plugs 295 may be spaced apart from each other in the second direction D2 on the source/chain electrode 265, as best seen in FIG. 1. However, the inventive concept is not limited thereto. Each of the first to third contact plugs 280, 290 and 295 may include a metal, a metal nitride, a metal silicide, doped polysilicon, etc.

In example embodiments, a third distance S3 in the first direction D1 between the first contact plug 280 and each of the second and third contact plugs 290 and 295 may be greater than a minimum distance in the first direction D1 between the gate electrode 250 and of the source/drain electrodes 260 and 265, that is, the first distance S1. Further, the third distance S3 may be greater than maximum distance in the first direction D1 between the gate electrode 250 and each of the source/drain electrodes 260 and 265, that is, the second distance S2. In some example embodiments, as discussed above, a plurality of first contact plugs 280 may be spaced apart from each other in the first direction D1 on the gate electrode 250. In this case, the third distance S3 may be from an outermost first contact plug 280 and each of the second and third contact plugs 290 and 295.

The first wiring 310 may extend in the first direction D1, and may commonly contact the first contact plugs 280 that are spaced apart from each other in the first direction D1 on the gate electrode 250. Each of the second and third wirings 320 and 325 may commonly contact the second and third contact plugs 290 and 295, respectively, each of which may be spaced apart from each other in the second direction D2 on the corresponding one of the source/drain electrodes 260 and 265. That is, the second wiring 320 may commonly contact the second contact plugs 290, and the third wiring 325 may commonly contact the third contact plugs 295.

Each of the first to third wirings 310, 320 and 325 may include a metal, a metal nitride, a metal silicide, doped polysilicon, etc.

As illustrated above, each of the source/drain electrodes 260 and 265 may include the vertical portion extending in the third direction D3 and the horizontal portion extending in the horizontal direction from the vertical portion thereof, and the minimum distance from the gate electrode 250 to each of the source/drain electrodes 260 and 265, which may be the first distance S1 from the gate electrode 250 to the horizontal portion of each of the drain electrodes 260 and 265, may be less than the second distance S2 from the gate electrode 250 to the vertical portion of each of the drain electrodes 260 and 265.

The second portion of the channel 180 between the gate electrode 250 and the vertical portion of each of the source/drain electrodes 260 and 265 may not serve as a channel due to the insulation layer 130, and only the first portion of the channel 180 between the gate electrode 250 and the horizontal portion of each of the source/drain electrodes 260 and 265 may serve as the channel. Thus, in a transistor including the gate electrode 250, the channel 180 and the source/drain electrodes 260 and 265, the distance between the gate electrode 250 and each of the source/drain electrodes 260 and 265 having the first portion of the channel 180 therebetween may be small, so that the transistor may have increased on-current and enhanced performance and subthreshold swing characteristics.

Particularly, when the channel 180 includes an oxide semiconductor, the channel 180 may have a lower off-current and a lower on-current due to a lower mobility than a lower off-current and a lower on-current of a channel including, e.g., silicon. However, the channel 180 that includes the oxide semiconductor may have the increased on-current as compared to a related art transistor that does not include the gate electrode 250, the channel 180 and the source/drain electrodes 260 and 265 configured as in FIGS. 1-2, because the distance between the gate electrode 250 and each of the source/drain electrodes 260 and 265 is small.

Further, a plurality of first portions of the channel 180 may be spaced apart from each other in the third direction D3 and a plurality of horizontal portions of each of the source/drain electrodes 260 and 265 may be spaced apart from each other in the third direction D3, and thus a width in the third direction D3 of the first portion of the channel 180, which may be disposed between the gate electrode 250 and each of the source/drain electrodes 260 and 265 and serve as an active channel, may be increased as compared to a related art transistor that does not include the gate electrode 250, the channel 180 and the source/drain electrodes 260 and 265 configured as in FIGS. 1-2, so that the above effect may be increased.

The third distance S3 between the outermost one of the first contact plugs 280 on the gate electrode 250 and each of the second and third contact plugs 290 and 295 on the corresponding one of the source/drain electrodes 260 and 265 may be greater than the first distance S1, which may be the minimum distance between the gate electrode 250 and each of the source/drain electrodes 260 and 205, and further may be greater than the second distance S2 therebetween. Thus, the parasitic capacitance between the first contact plug 280 and each of the second and third contact plugs 290 and 295 may decrease as compared to a related art transistor that does not include the gate electrode 250, the channel 180 and the source/drain electrodes 260 and 265 configured as in FIGS. 1-2, and the first insulating interlayer 270 therebetween may be prevented from being broken by the breakdown voltage (BV).

FIGS. 3 to 21 are plan views and cross-sectional views illustrating a method of manufacturing a semiconductor device in accordance with example embodiments. Particularly, FIGS. 3, 5, 7, 9, 11, 13, 15, 18 and 20 are the plan views, and FIGS. 4, 6, 8, 10, 12, 14, 16-17, 19 and 21 are cross-sectional views taken along lines A-A' in their corresponding plan views, respectively.

Figure 3:
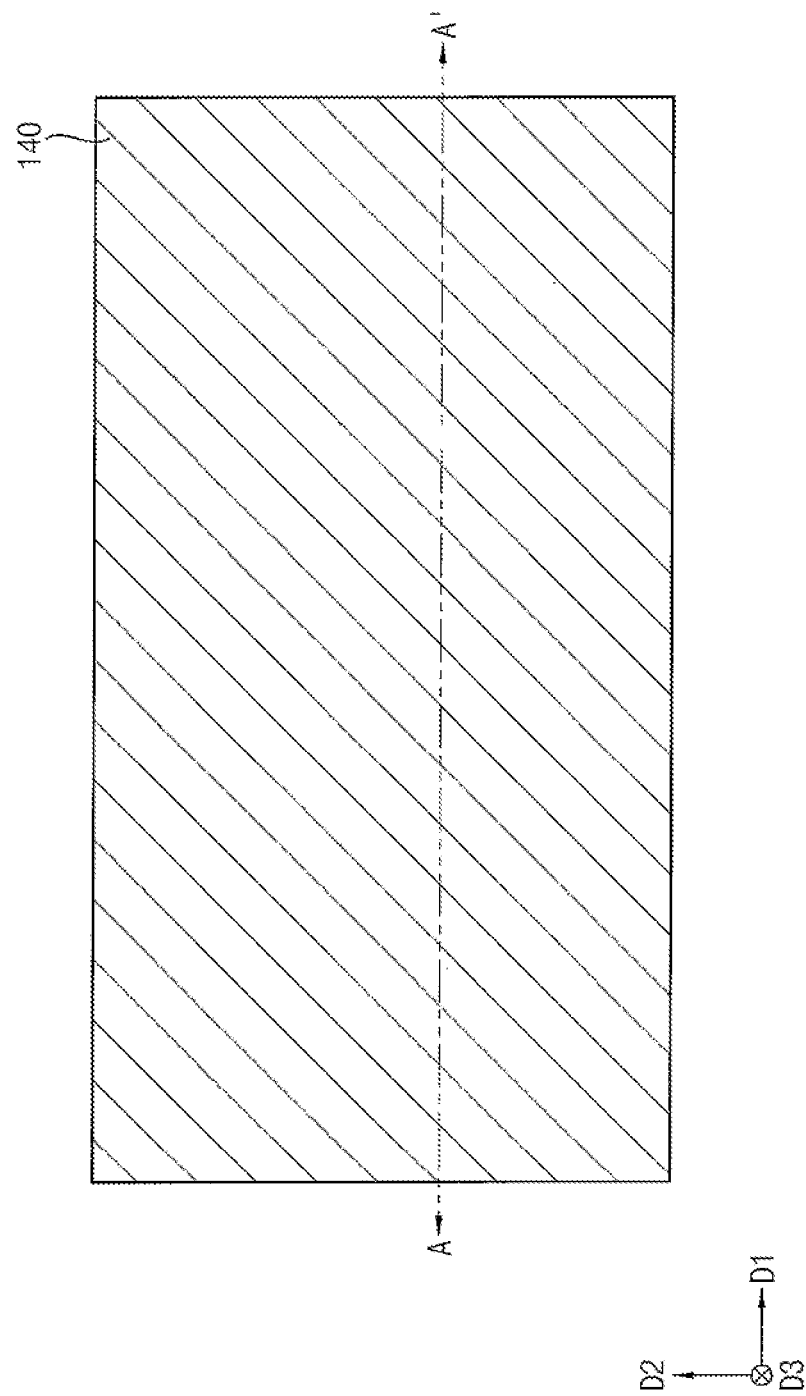
FIGS. 3 to 21 are plan views and cross-sectional views illustrating a method of manufacturing a semiconductor device in accordance with example embodiments.
Figure 4:
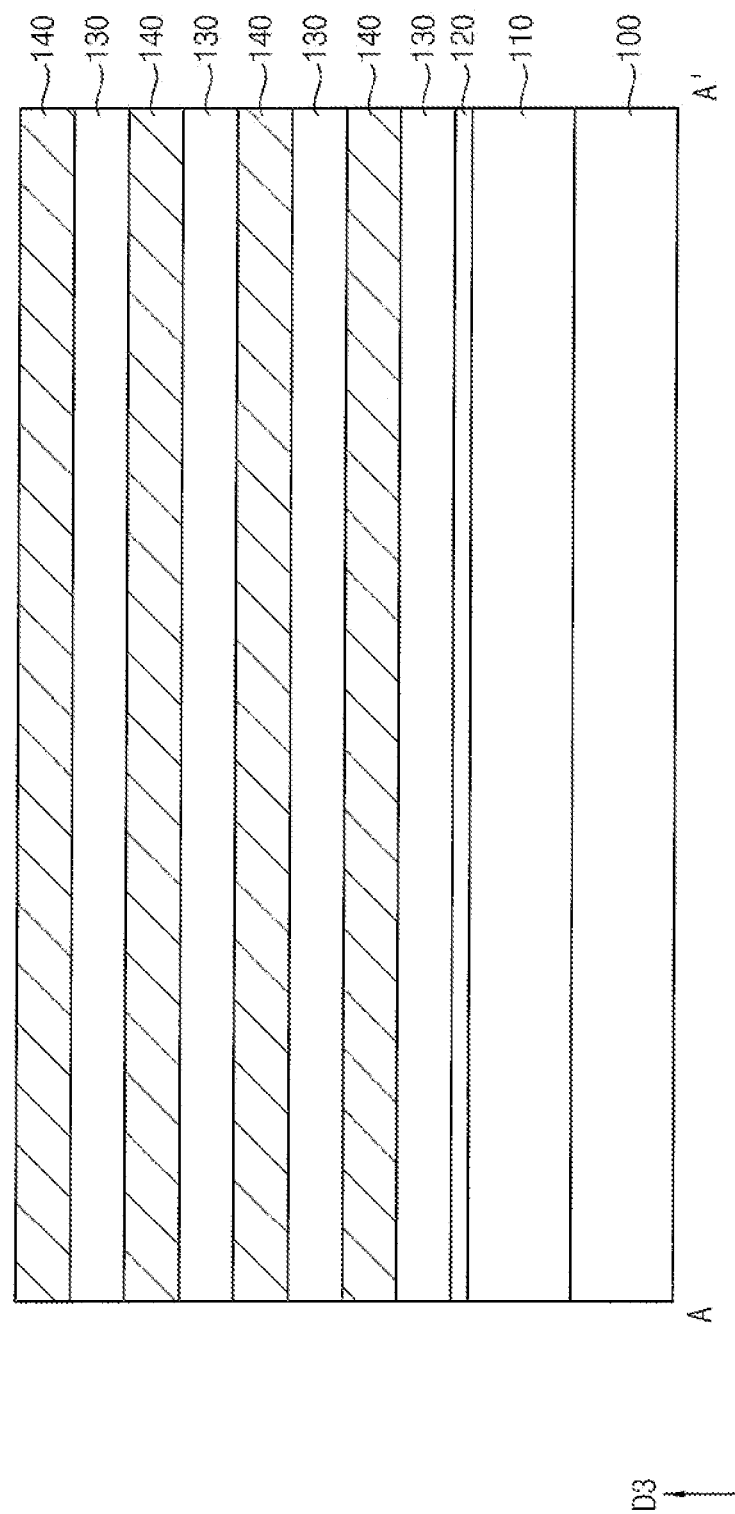

Referring to FIGS. 3 and 4, a pad layer 110 and an etch stop layer 120 may be sequentially stacked on a substrate 100, and an insulation layer 130 and a first sacrificial layer 140 may be alternately and repeatedly stacked on the etch stop layer 120 to form a mold layer including a plurality of the insulation layers 130 and a plurality of the first sacrificial layers 140.

The insulation layer 130 may include an oxide, e.g., silicon oxide, the first sacrificial layer 140 may include a material having an etching selectivity with respect to the insulation layer 130, e.g., a nitride such as silicon nitride, silicon-germanium, polysilicon, etc., and the etch stop layer 120 may include a material having an etching selectivity with respect to the insulation layer 130 and the first sacrificial layer 140, e.g., a metal oxide such as aluminum oxide.

Figure 5:
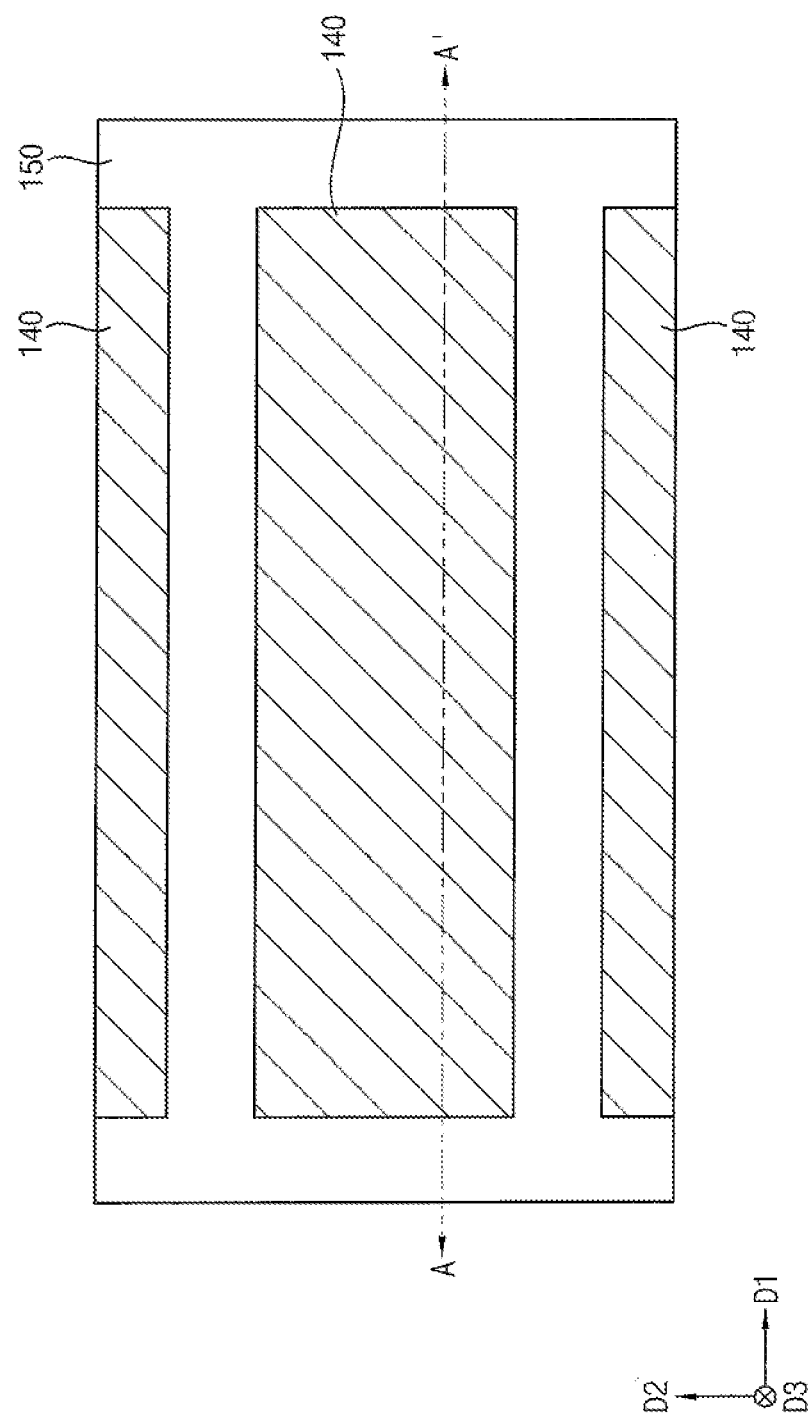
Figure 6:
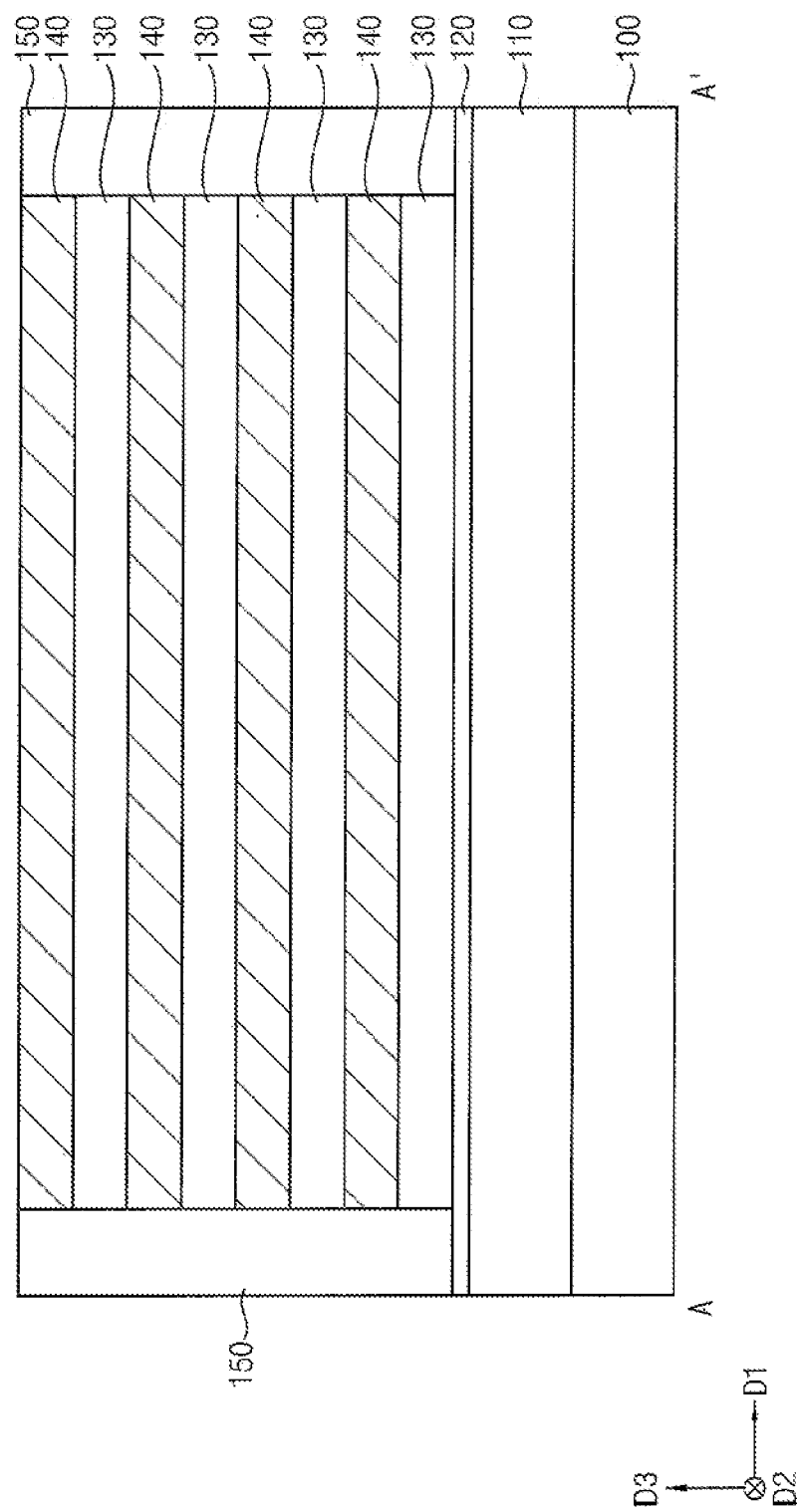

Referring to FIGS. 5 and 6, the mold layer may be partially etched to form a first opening exposing an upper surface of the etch stop layer 120, and a division layer 150 may be formed in the first opening.

The division layer 150 may include an oxide, e.g., silicon oxide, and thus, in some embodiments, may be merged with the insulation layer 130.

As the division layer 150 is formed, the mold layer including the insulation layer 130 and the first sacrificial layer 140 may be divided into a plurality of molds spaced apart from each other in each of the first and second directions D1 and D2. In an example embodiment, each of the molds may extend in the first direction D1.

Figure 7:
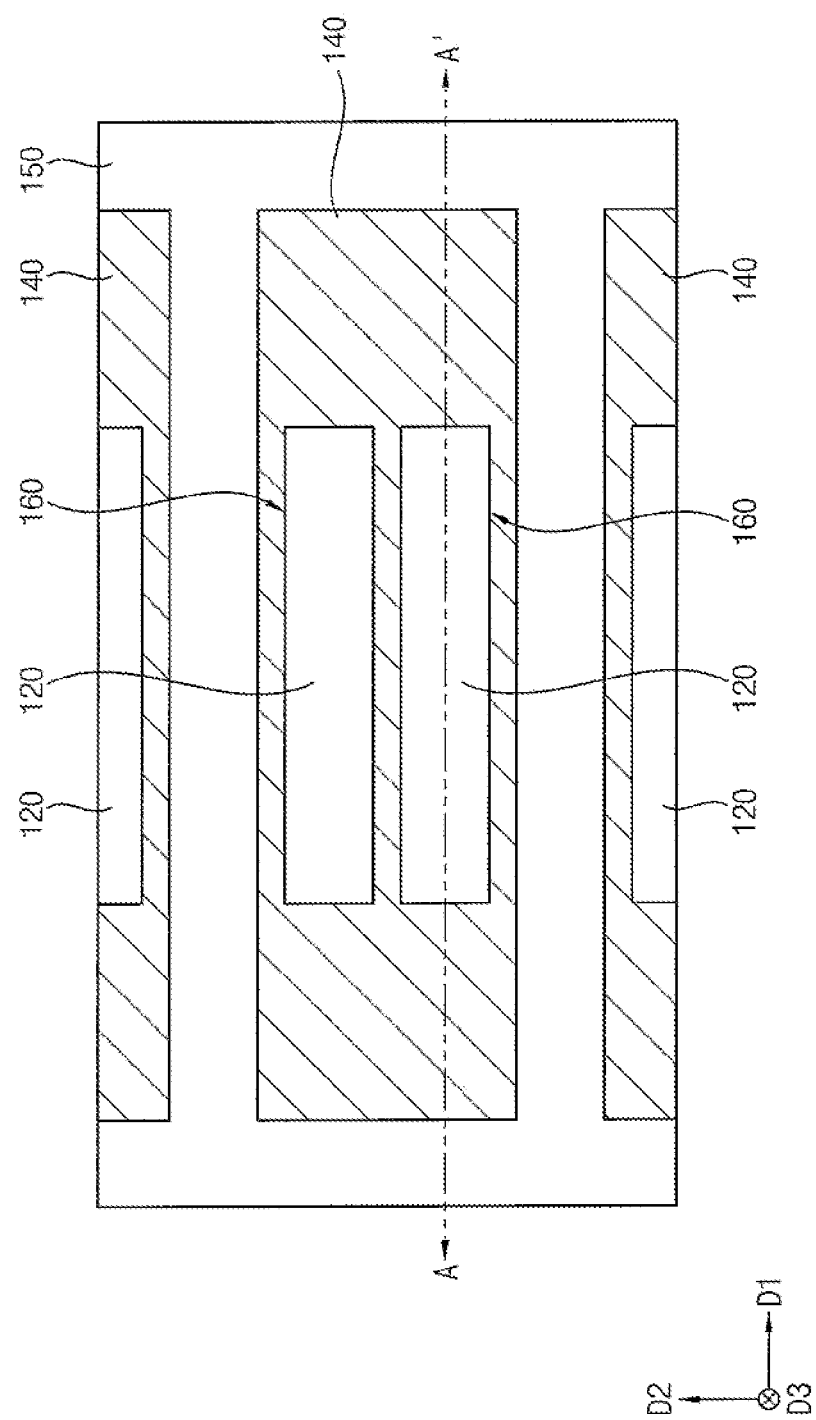
Figure 8:
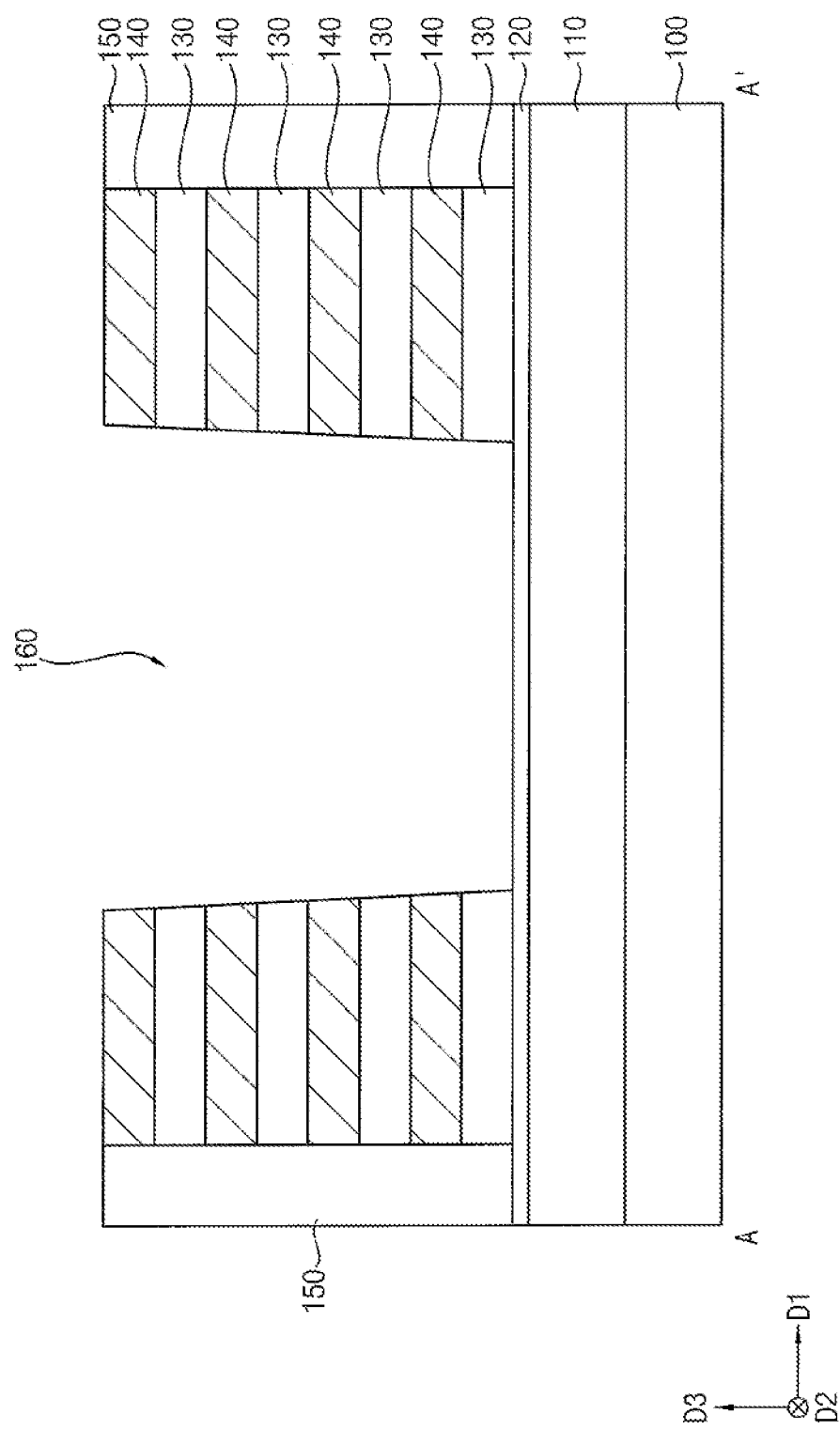

Referring to FIGS. 7 and 8, each of the molds may be partially etched to form a second opening 160 exposing an upper surface of the etch stop layer 120.

In example embodiments, a plurality of second openings 160 may be formed to be spaced apart from each other at a central portion in the first direction D1 of each of the molds, and FIG. 7 shows two second openings 160 in each of the molds. However, in some embodiments, only one second opening 160 may be formed in each of the molds.

In an example embodiment, each of the second openings 160 may extend the first direction D1.

Figure 9:
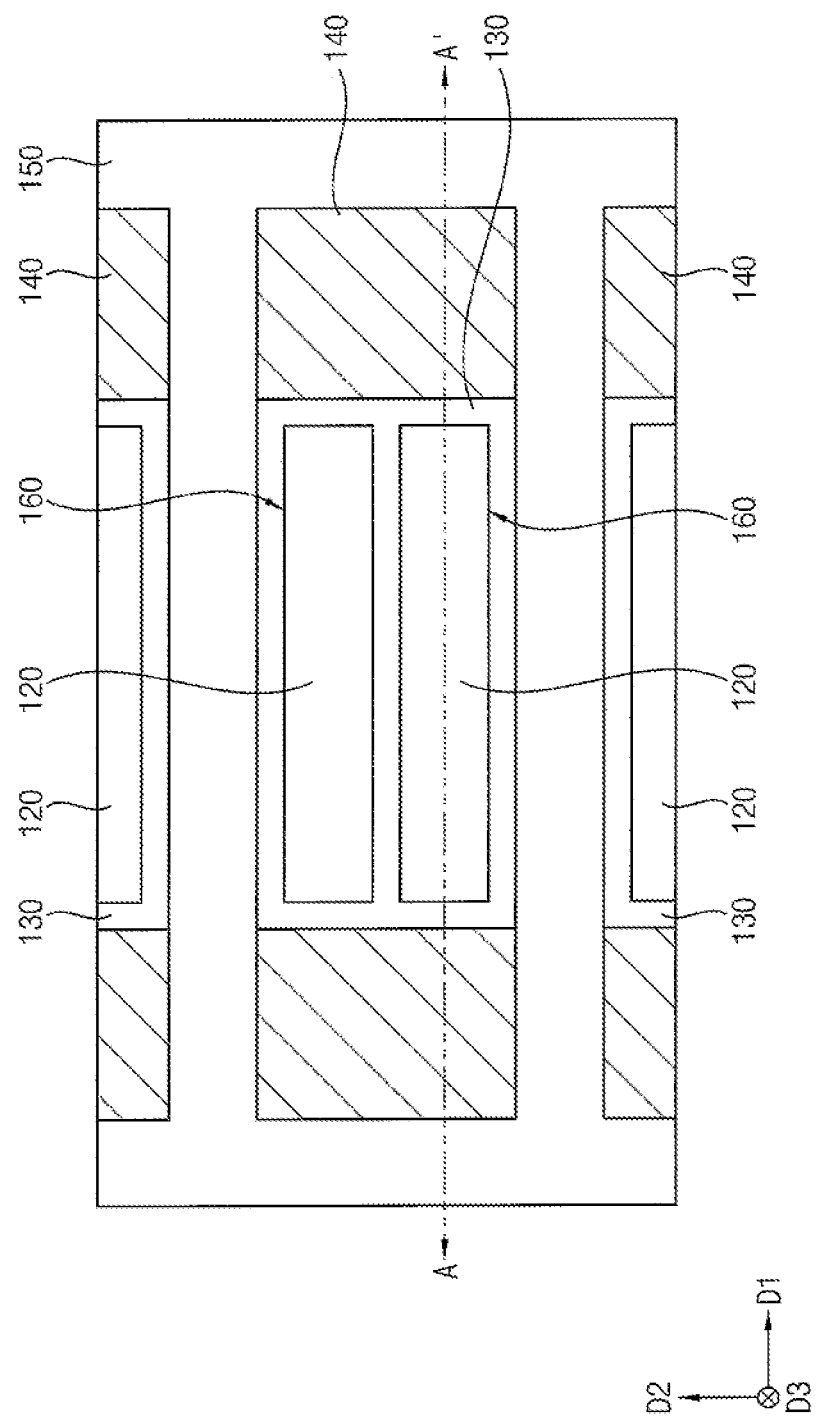
Figure 10:
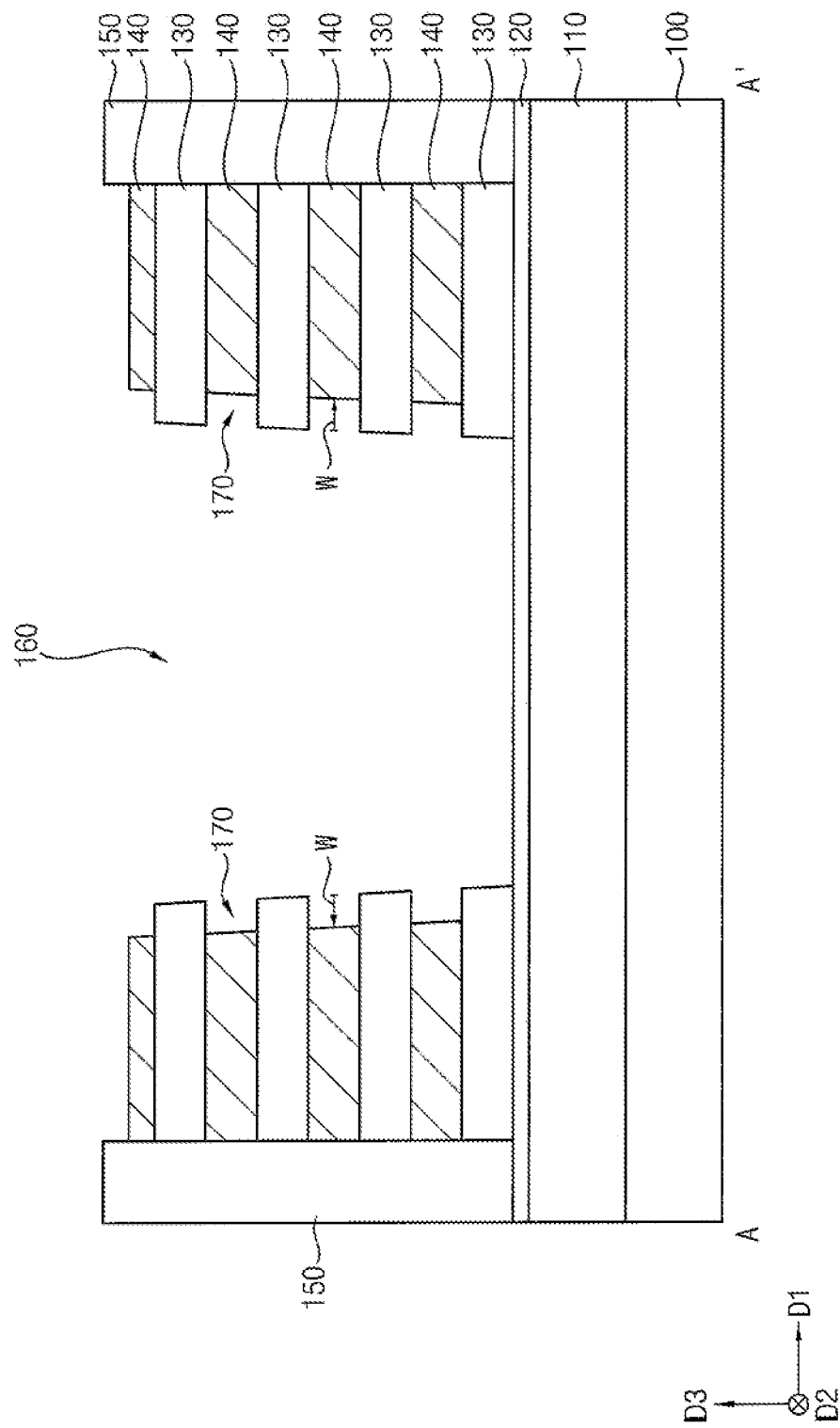

Referring to FIGS. 9 and 10, a portion of each of the first sacrificial layers 140 adjacent to the second opening 160 may be removed to form a first recess 170 in each of the first sacrificial layers 140 adjacent to the second opening.

In example embodiments, the first recess 170 may be formed by a wet etching process, and thus an upper portion of an uppermost one of the first sacrificial layers 140 may be also removed. The first recess 170 may be connected to the second opening 160, and the first recess 170 between neighboring ones of the insulation layers 130 in the third direction D3 may have a width W from a sidewall of the second opening 160 in the first direction D1.

In an example embodiment, a portion of each of the first sacrificial layers 140 between the second openings 160 spaced apart from each other in the second direction D2 in each of the molds may be entirely removed. However, the inventive concept is not limited thereto and, in some example embodiments, if a distance between the second openings 160 spaced apart from each other in the second direction D2 is large, a portion of each of the first sacrificial layers 140 between the second openings 160 may not be entirely removed but partially remain.

Figure 11:
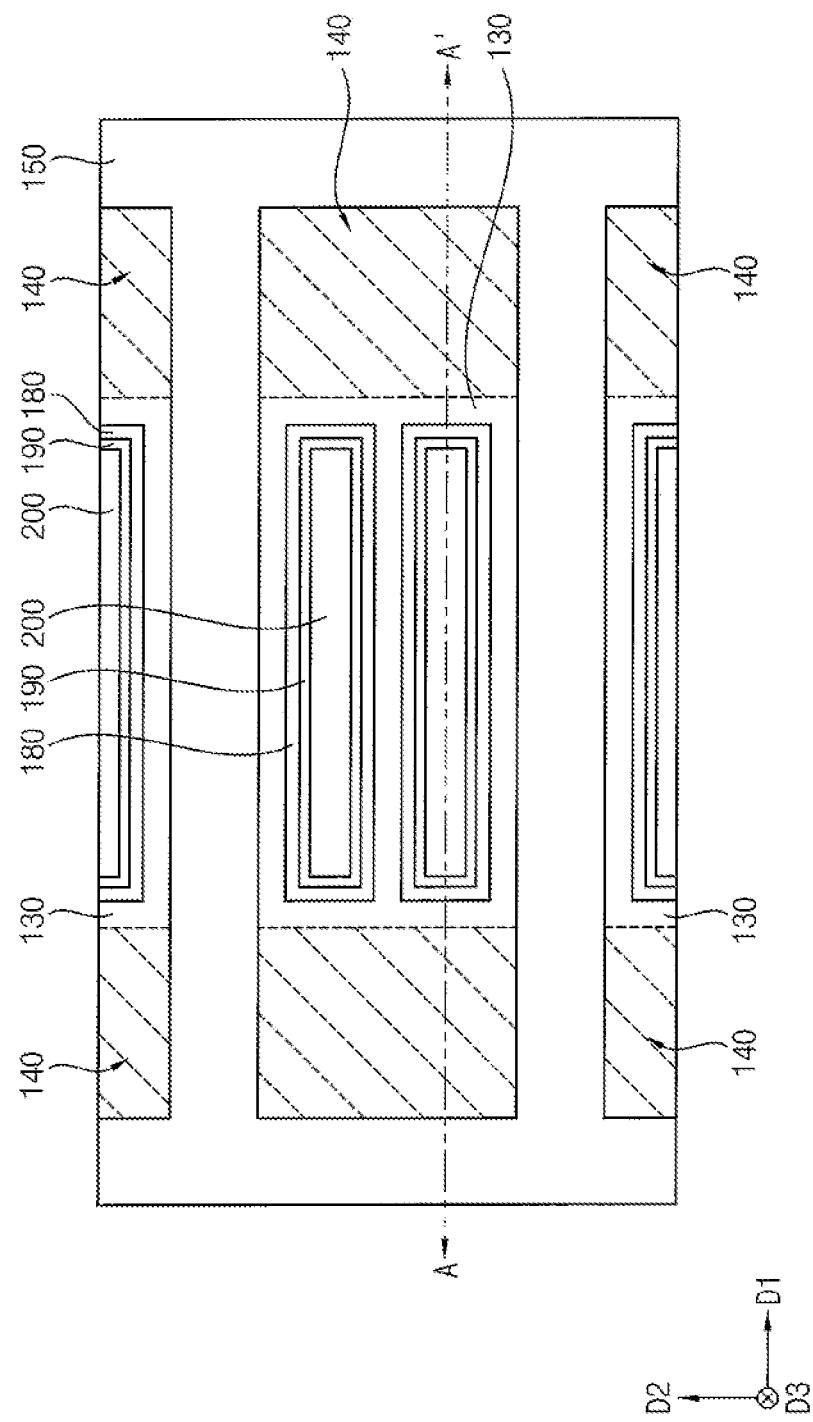
Figure 12:
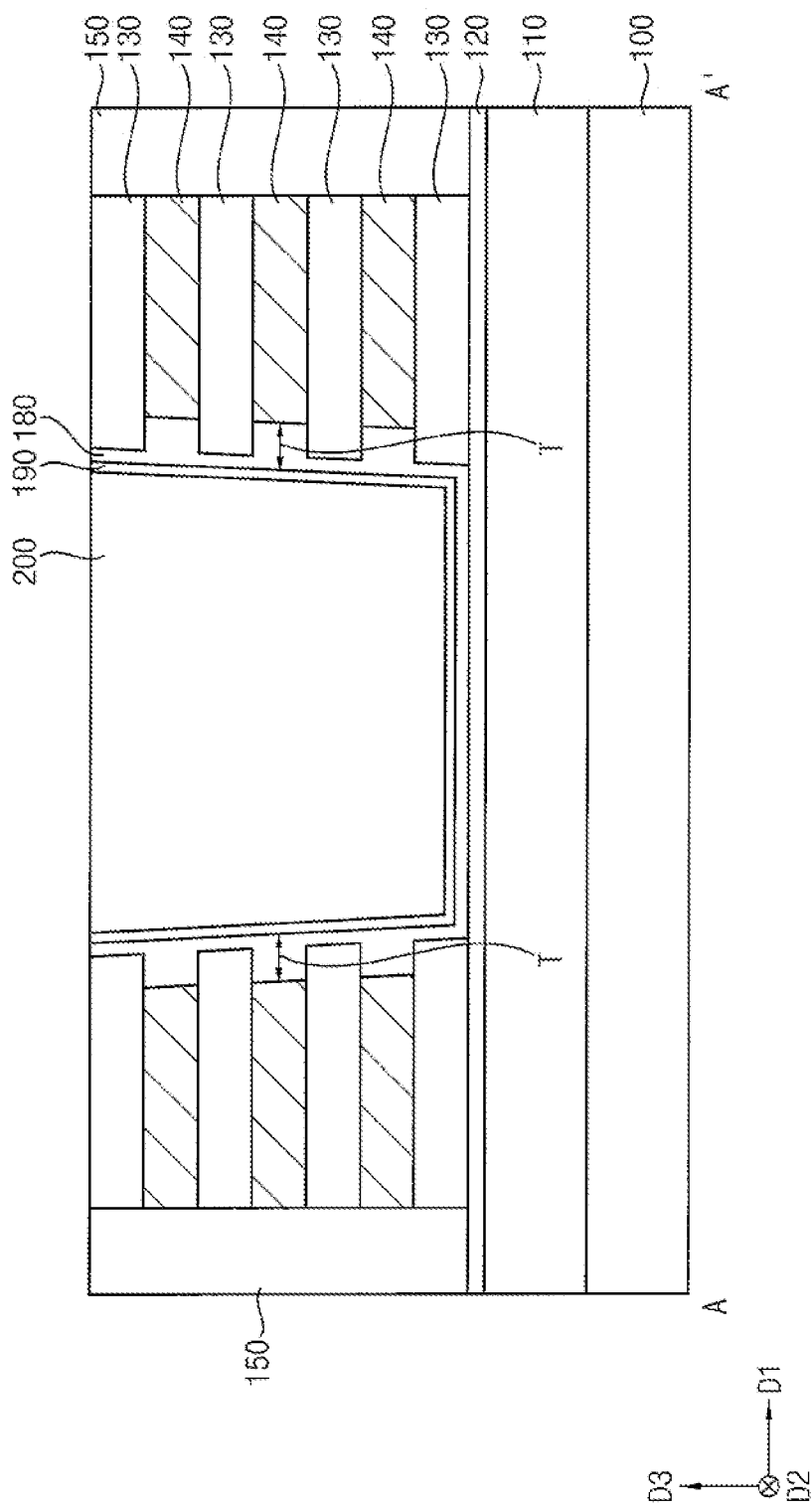

Referring to FIGS. 11 and 12, a channel layer may be formed on the etch stop layer 120, the first sacrificial layers 140, the insulation layers 130 and the division layer 150 to fill the first recess 170, a gate insulation layer may be formed on the channel layer, and a second sacrificial layer may be formed to fill the second opening 160.

The second sacrificial layer may include a material having an etching selectivity with respect to the insulation layer 130, the first sacrificial layer 140 and the division layer 150, e.g., polysilicon.

The second sacrificial layer, the gate insulation layer and the channel layer may be planarized until upper surfaces of an uppermost one of the insulation layers 130 and the division layer 150 are exposed. Thus, a channel 180 filling the first recess 170 and contacting sidewalls of the insulation layers 130 and the first sacrificial layers 140 and the upper surface of the etch stop layer 120 may be formed. Additionally, a gate insulation pattern 190 may be formed on the channel 180, and a second sacrificial pattern 200 filling the second opening 160 may be formed on the gate insulation pattern 190.

The planarization process may be performed by, e.g., a chemical mechanical polishing (CMP) process and/or an etch back process.

A thickness T of the channel 180 between the insulation layers 130 stacked in the third direction D3 may be proportional to the width W of the first recess 170 in the first direction D1 that may be formed by the processes illustrated with reference to FIGS. 9 and 10, and thus, the thickness T of the channel 180 in the first direction D1 may be adjusted by controlling the wet etching process for forming the first recess 170.

Figure 13:
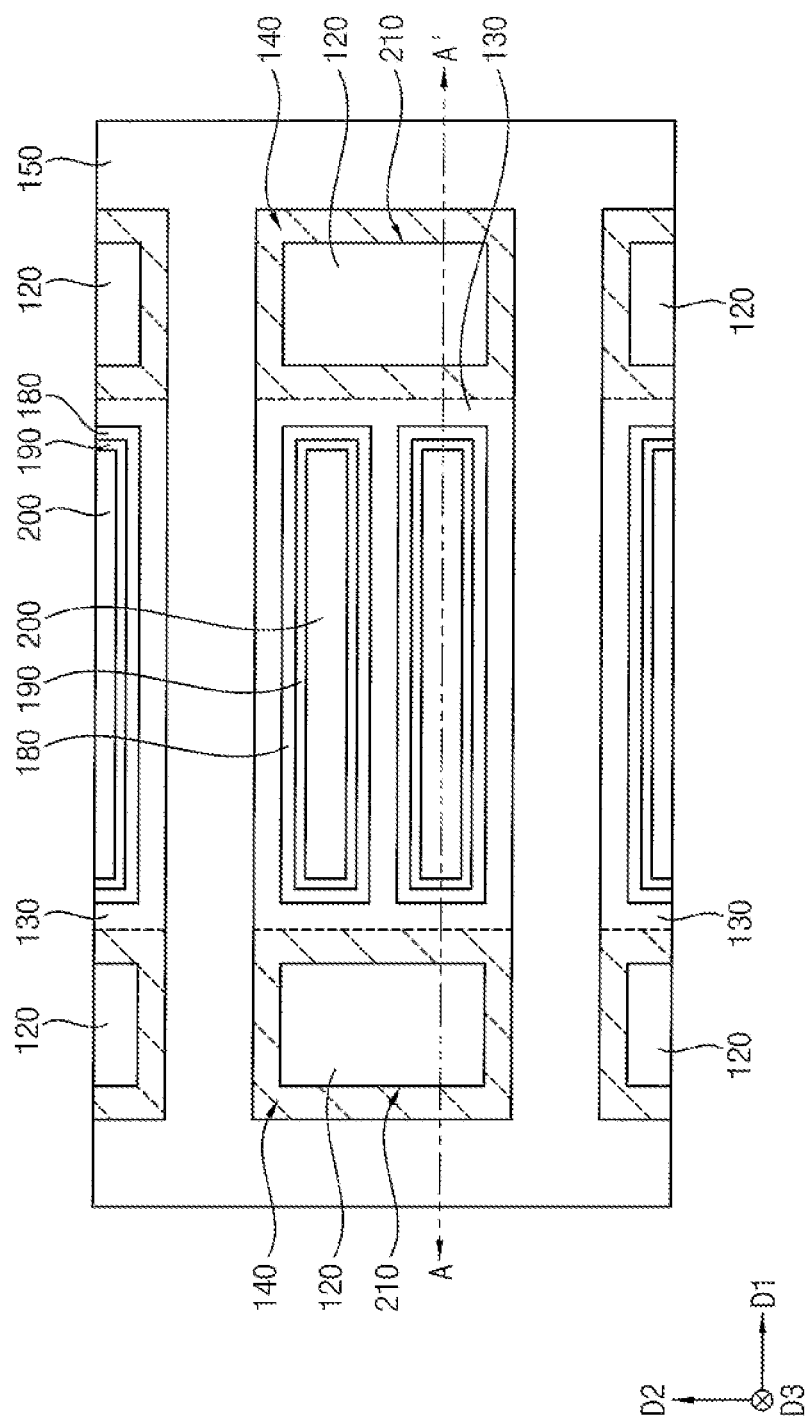
Figure 14:
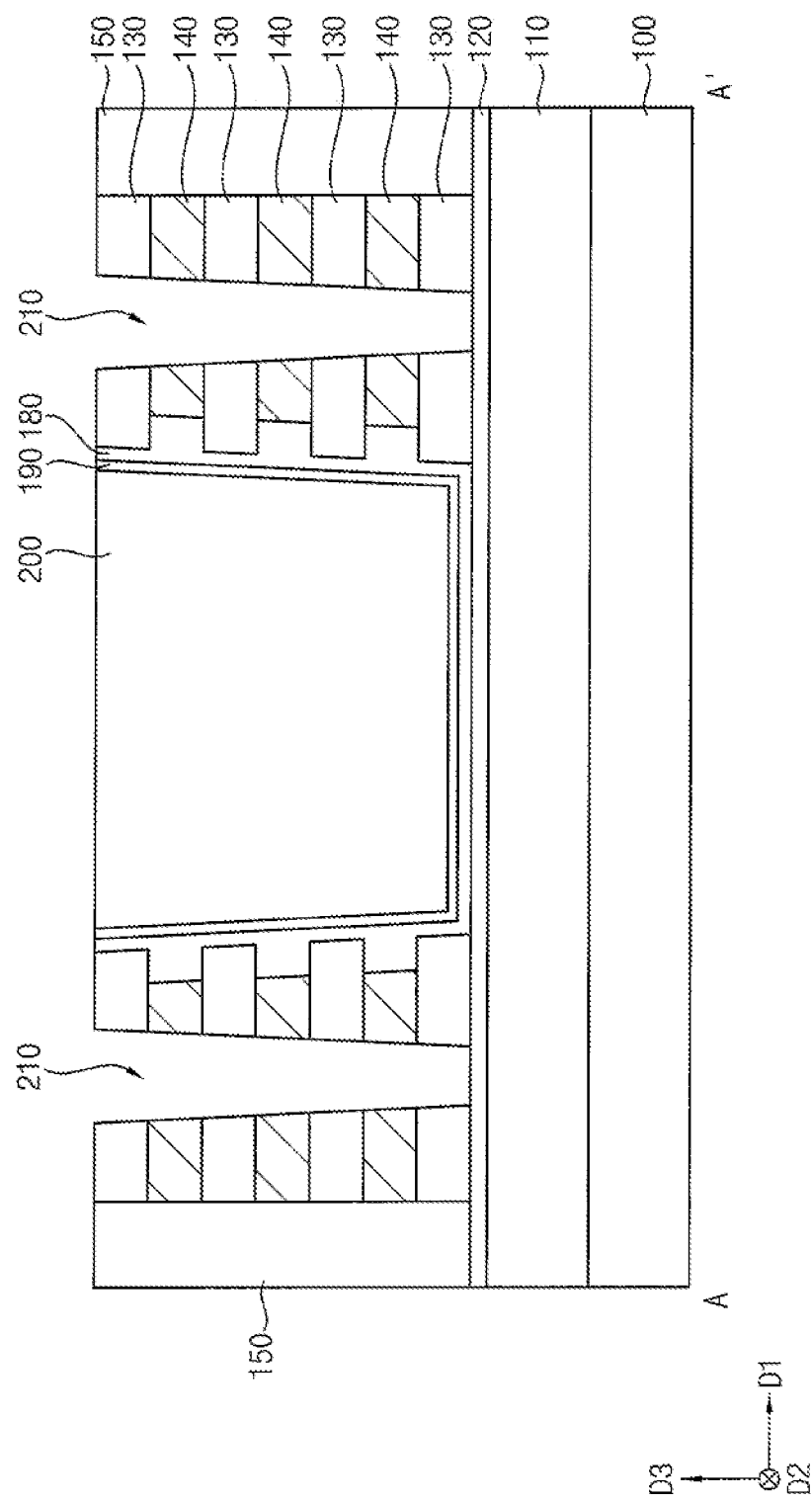

Referring to FIGS. 13 and 14, each of the molds may be partially etched to form third openings 210 exposing an upper surface of the etch stop layer 120.

In example embodiments, a third opening 210 may be formed at each of opposite sides in the first direction D1 of the second sacrificial pattern 200. Thus, the insulation layers 130 and the first sacrificial layers 140 in each of the molds may be partially exposed by the third openings 210.

Figure 15:
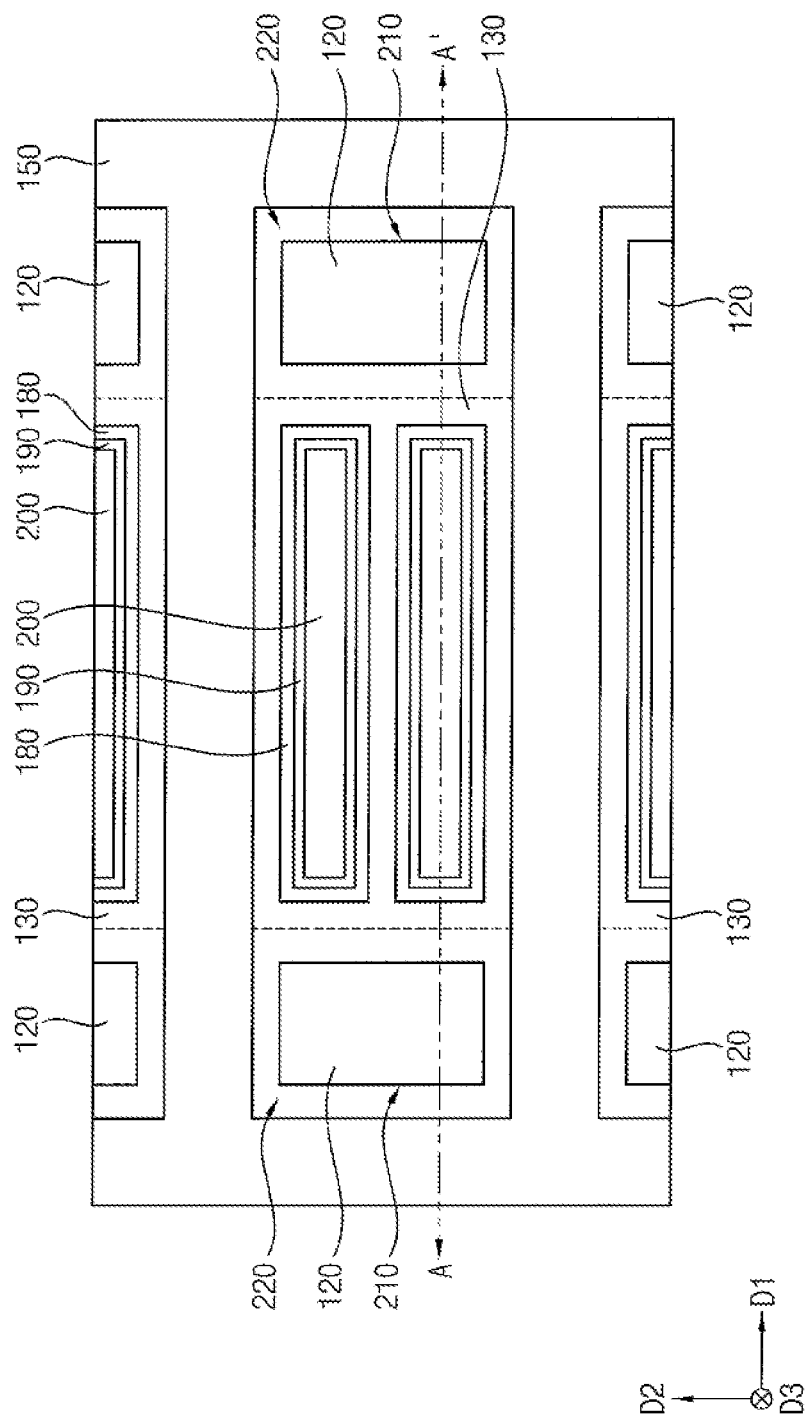
Figure 16:
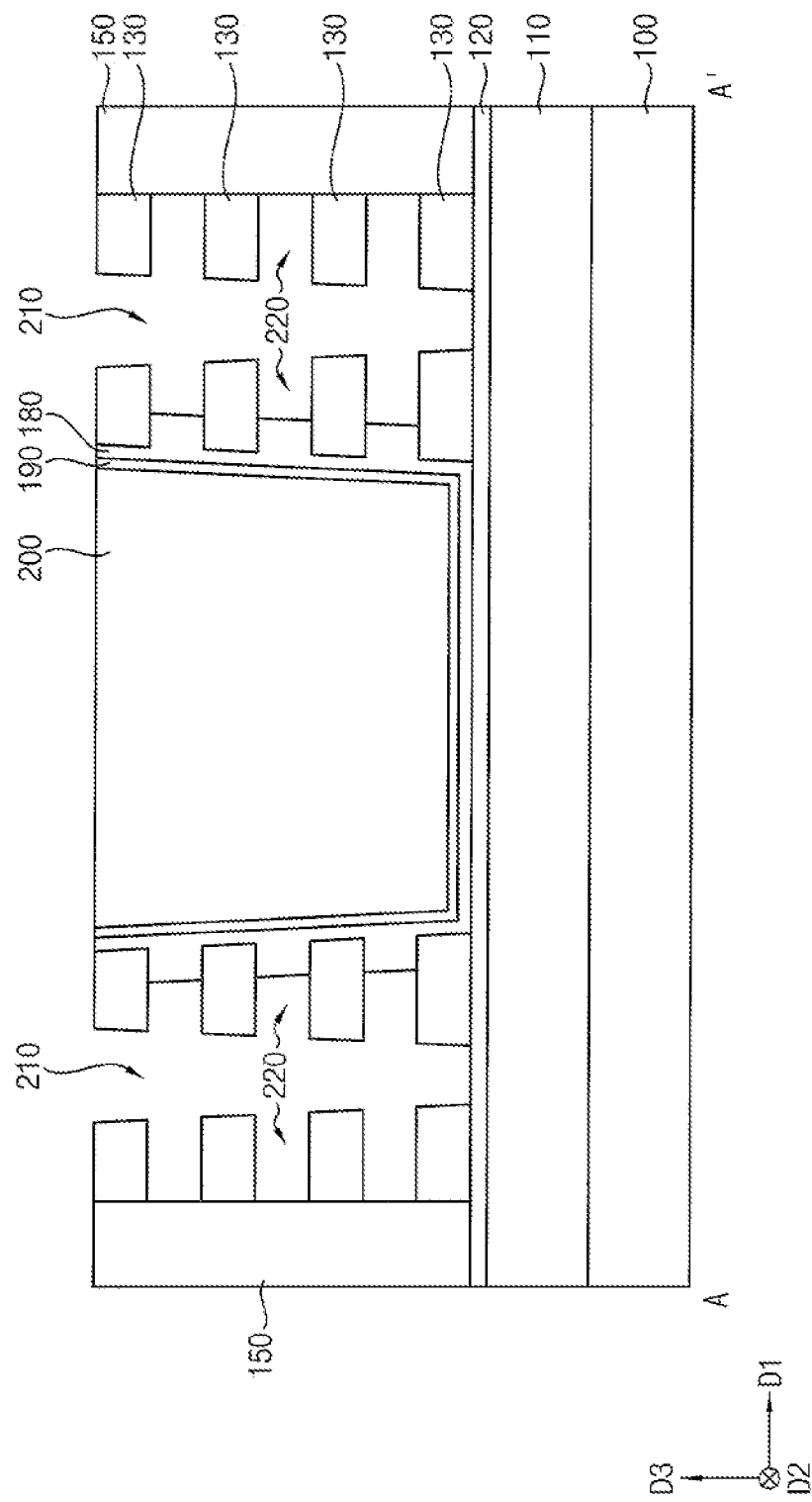

Referring to FIGS. 15 and 16, the first sacrificial layers 140 exposed by the third openings 210 may be removed, and a second recess 220 may be formed between adjacent ones of the insulation layers 130 stacked in the third direction D3.

In example embodiments, the second recess 220 may be formed by a wet etching process. As the second recess 220 is formed, an outer sidewall of the channel 180, a sidewall of the division layer 150 and lower and upper surfaces of each of the insulation layers 130 may be exposed.

Figure 17:
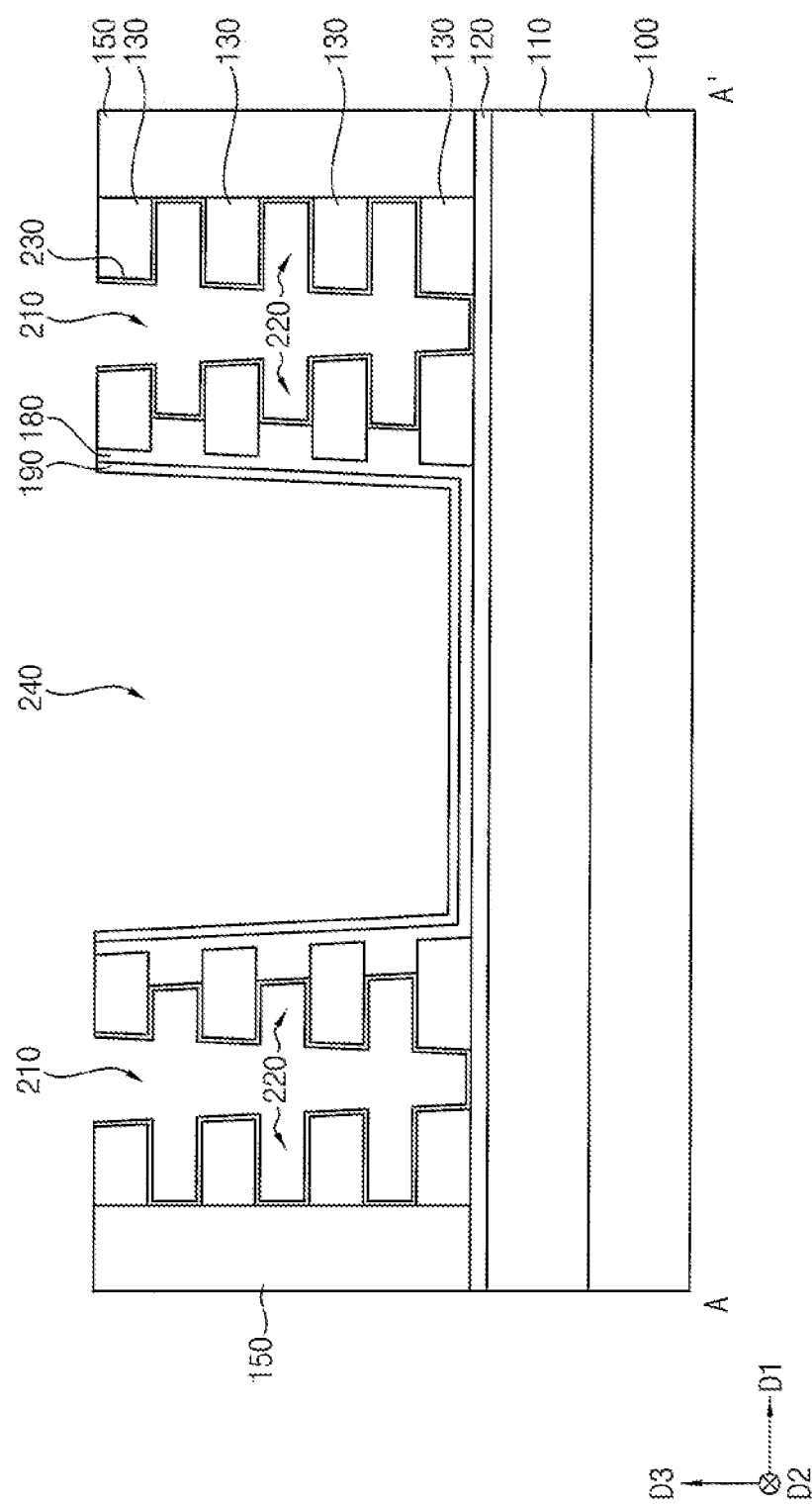

Referring to FIG. 17, a barrier pattern 230 may be formed on the upper surface of the etch stop layer 120 and the sidewalls and the lower and upper surfaces of each of the insulation layers 130 and the sidewall of the division layer 150 exposed by the third opening 210 and the second recess 220.

The barrier pattern 230 may be formed by forming a barrier layer on the upper surface of the etch stop layer 120 and the sidewalls and the lower and upper surfaces of each of the insulation layers 130 exposed by the third opening 210 and the second recess 220 and the sidewall and upper surfaces of the division layer 150, the channel 180, the gate insulation pattern 190 and the second sacrificial pattern 200, and removing portions of the barrier layer on the upper surfaces of the division layer 150, the channel 180, the gate insulation pattern 190 and the second sacrificial pattern 200 and a portion of the barrier layer on the upper surface of the uppermost one of the insulation layers 130.

The second sacrificial pattern 200 may be removed to form a fourth opening 240, and thus an upper surface of the gate insulation pattern 190 may be exposed.

Figure 18:
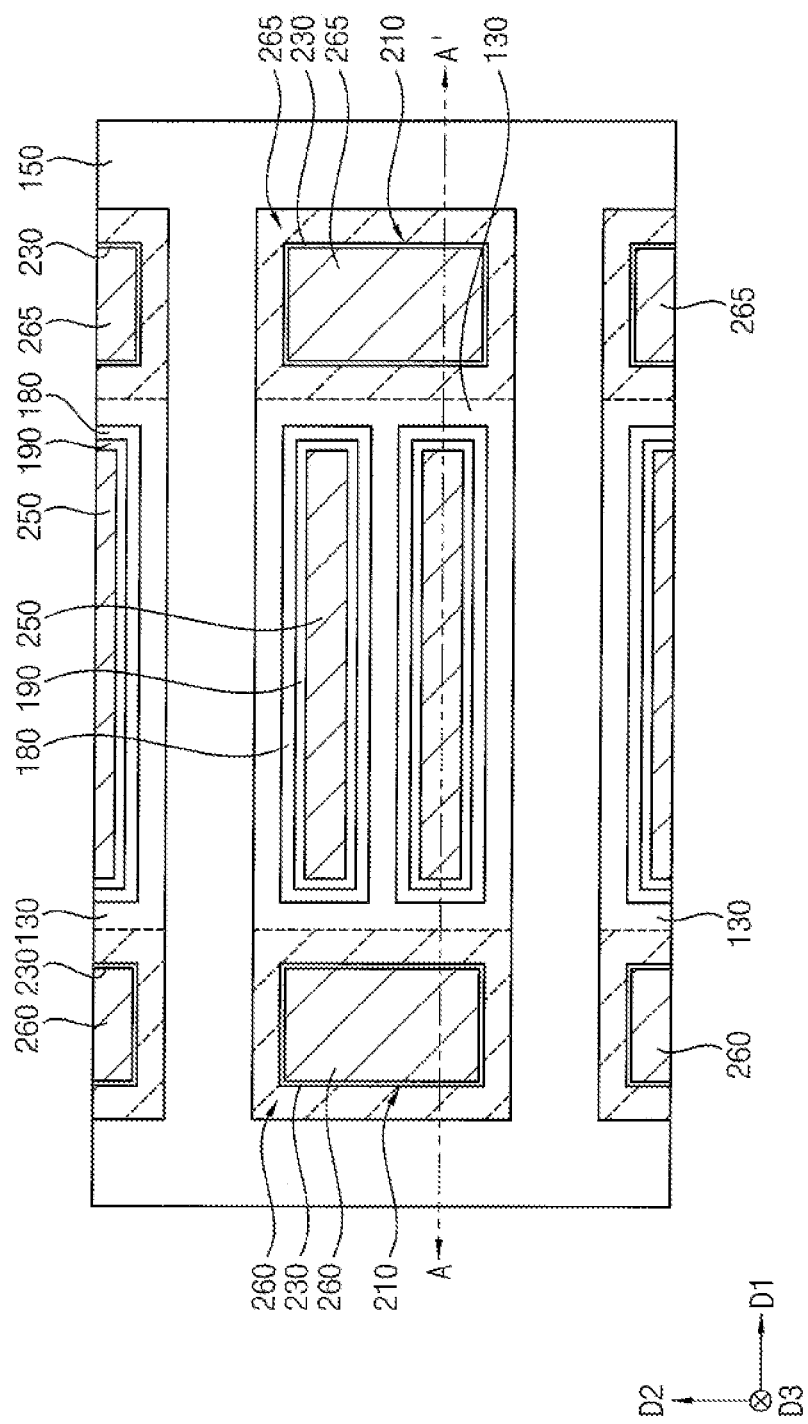
Figure 19:
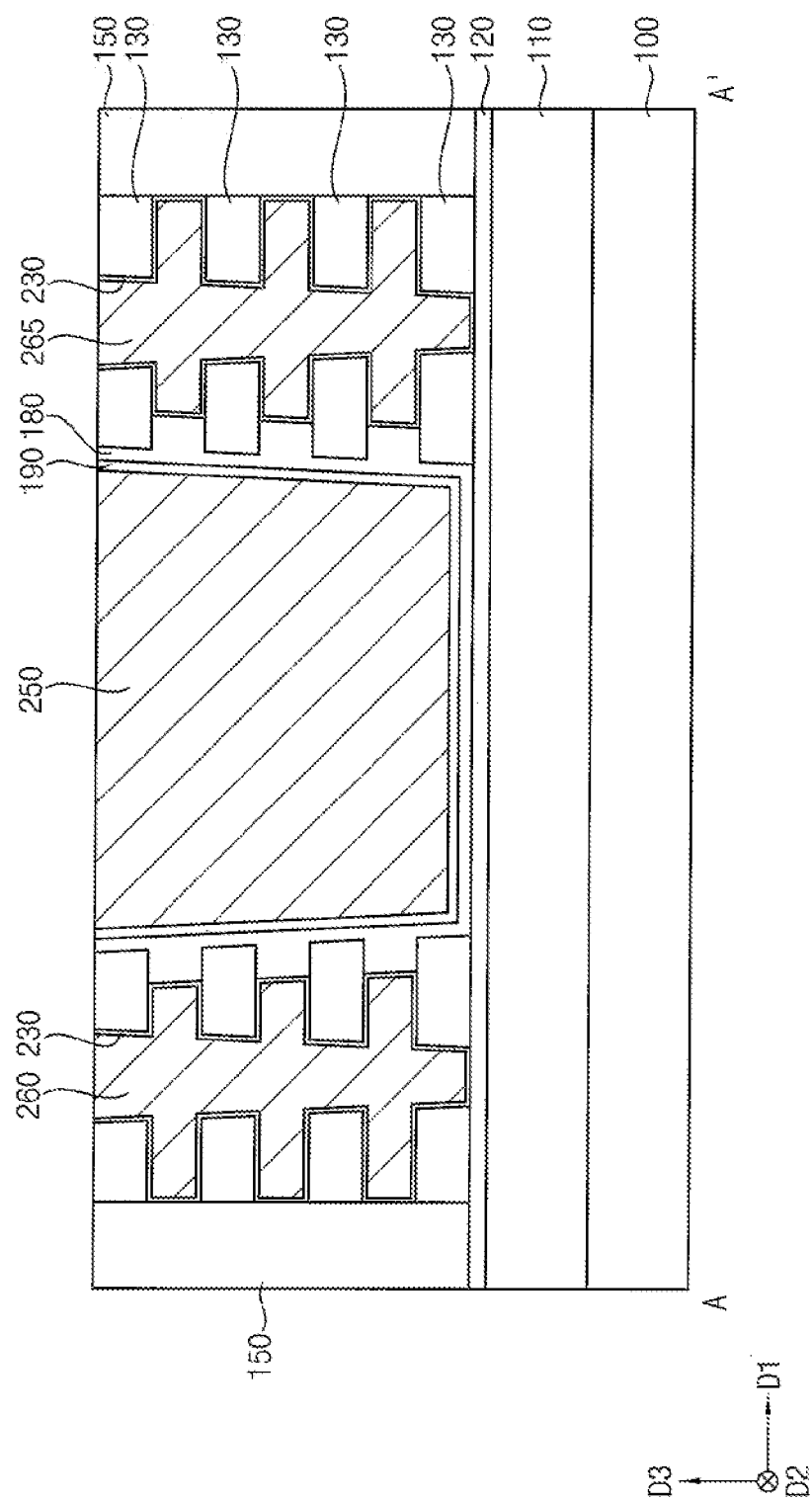

Referring to FIGS. 18 and 19, a gate electrode 250 filling the third opening 210 and source/drain electrodes 260 and 265 filling the fourth opening 240 and the second recess 220 may be formed.

The gate electrode 250 and the source/drain electrodes 260 and 265 may be formed by forming a conductive layer on the gate insulation pattern 190, the barrier pattern 230, the uppermost one of the insulation layers 130, the division layer 130 and the channel 180 to fill the third and fourth openings 210 and 240 and the second recess 220, and planarizing the conductive layer until the upper surfaces of the uppermost one of the insulation layers 130 and the division layer 150 are exposed.

Each of the source/drain electrodes 260 and 265 and the barrier pattern 230 covering a sidewall and a lower surface of each of the source/drain electrodes 260 and 265 may form a source/drain electrode structure.

Figure 20:
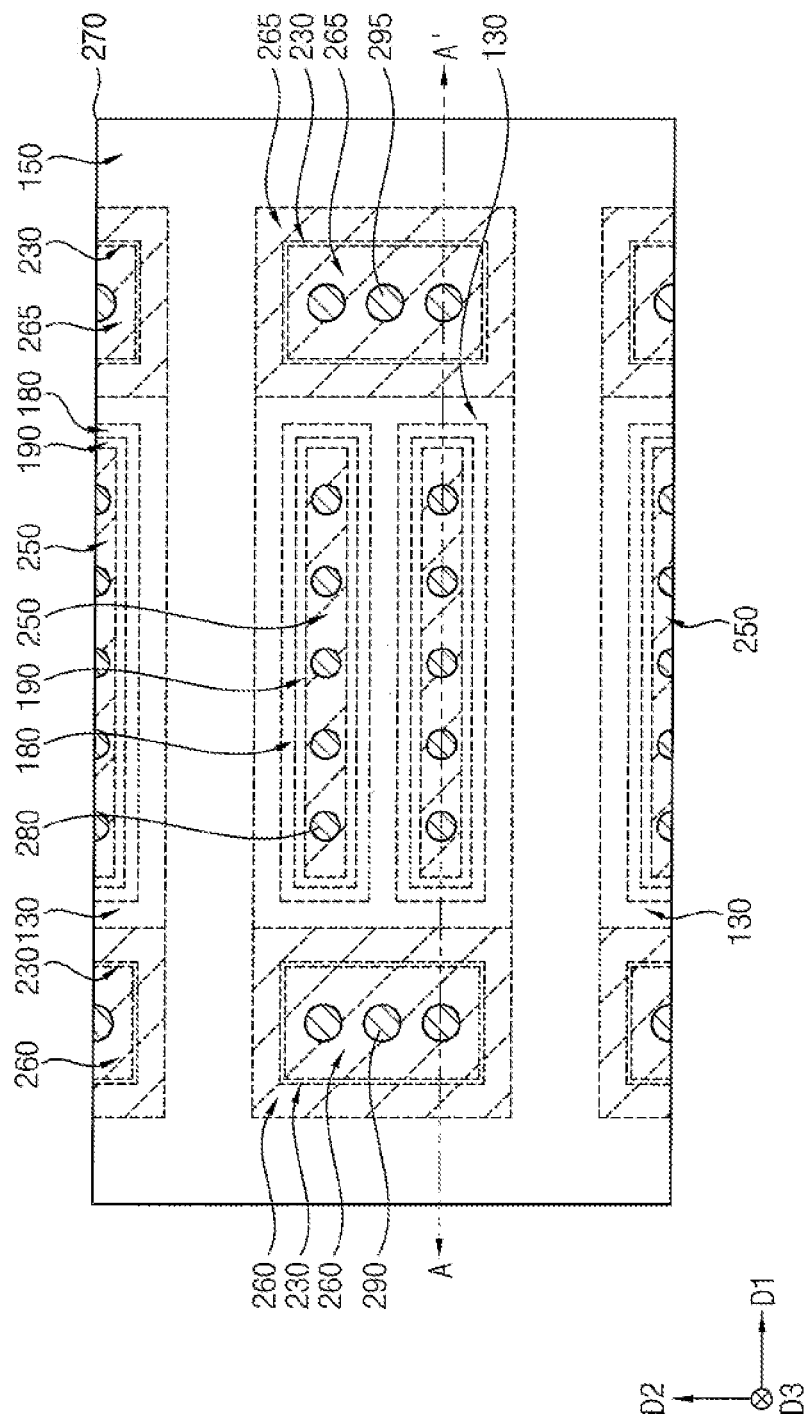
Figure 21:
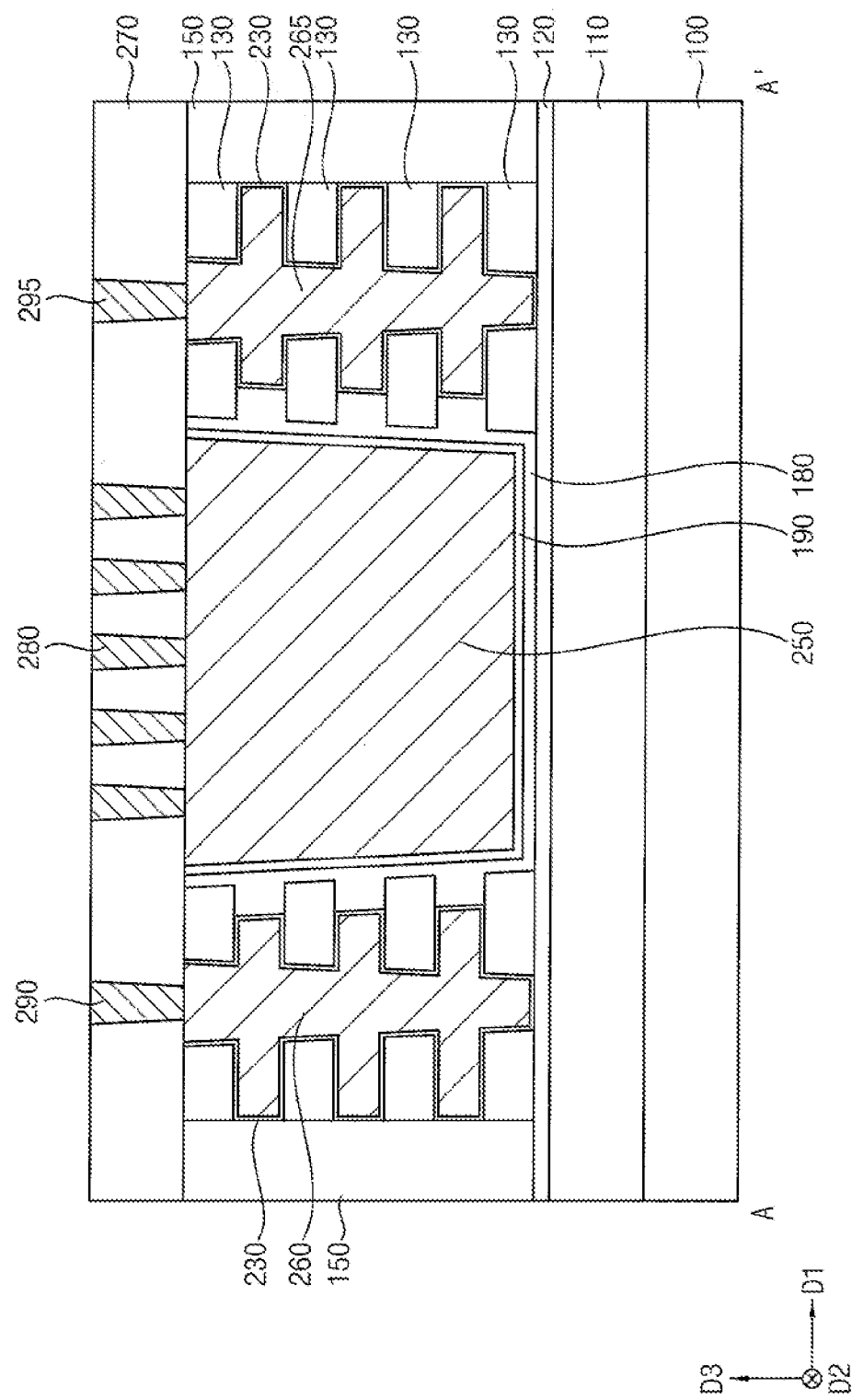

Referring to FIGS. 20 and 21, a first insulating interlayer 270 may be formed on the gate electrode 250, the source/drain electrodes 260 and 265, the uppermost one of the insulation layers 130, the division layer 150, the channel 180, the gate insulation pattern 190 and the barrier pattern 230, and first to third contact plugs 280, 290 and 295 may be formed to contact upper surfaces of the gate electrode 250 and the source/drain electrodes 260 and 265, respectively.

In example embodiments, one or a plurality of first contact plugs 280 may be formed on each of the gate electrodes 250. Five first contact plugs 280 spaced apart from each other in the first direction D1 are shown in FIG. 21. However, the inventive concept is not limited thereto.

In example embodiments, one or a plurality of second contact plugs 290 may be formed on the source/drain electrode 260 and one or a plurality of third contact plugs 295 may be formed on the source/chain electrode 265, and three second contact plugs 290 spaced apart from each other in the second direction D2 and three third contact plugs 295 spaced apart from each other in the second direction D2 are shown in FIG. 21. However, the inventive concept is not limited thereto.

Referring to FIGS. 1 and 2 again, a second insulating interlayer 300 may be formed on the first insulating interlayer 270 and the first to third contact plugs 280, 290 and 295, and the first, second and third wirings 310, 320 and 325 may be formed to contact upper surfaces of the first to third contact plugs 280, 290 and 295, respectively.

In example embodiments, the first wiring 310 may extend in the first direction D1 to contact the upper surfaces of the first contact plugs 280, the second wiring 320 may extend in the second direction D2 to contact the upper surfaces of the second contact plugs 290, and the third wiring 325 may extend in the second direction D2 to contact the upper surfaces of the third contact plugs 295.

The semiconductor device may be manufactured by the above processes.

As illustrated above, each of the molds including the insulation layers 130 and the first sacrificial layers 140 alternately stacked may be partially etched to form a second opening 160, the portion of the first sacrificial layer 140 adjacent to the second opening 160 may be removed to form the first recess 170, the channel 180 may be formed to fill the first recess 170, and the second sacrificial pattern 200 may be formed in the second opening 160. Each of the molds spaced apart from the second opening 160 in the first direction D1 may be partially etched to form the third opening 210, the first sacrificial layer 140 may be removed through the third opening 210 to form the second recess 220, and the second sacrificial pattern 200 may be removed to form the fourth opening 240. The gate electrode filling the fourth opening 240, and the source/drain electrodes 260 and 265 filling the third opening 210 and the second recess 220 may be formed, and the channel 180 may be formed between the gate electrode 250 and each of the source/drain electrodes 260 and 265.

The channel 180 may have the thickness T proportional to the width W in the first direction D1 of the first recess 170 (see FIGS. 10, 12), and thus, the thickness T of the channel 180 may be adjusted by controlling the etching process for forming the first recess 170.

Figure 22:
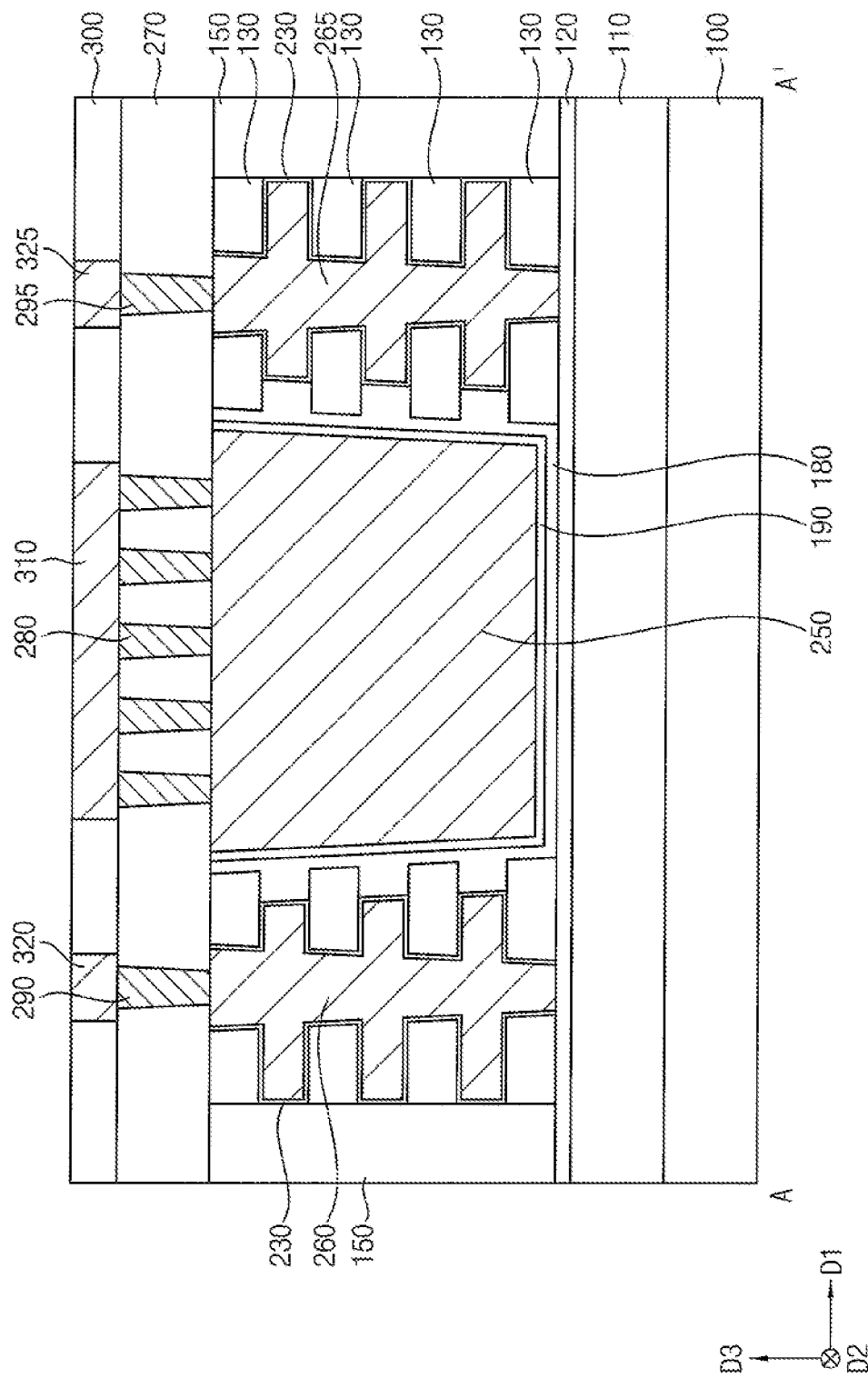
FIG. 22 is a cross-sectional view illustrating a semiconductor device in accordance with example embodiments.

FIG. 22 is a cross-sectional view illustrating a semiconductor device in accordance with example embodiments. The semiconductor device may be substantially the same as or similar to that of FIGS. 1 and 2, except for the source/drain electrode structure. Thus, like reference numerals refer to like elements, and detailed descriptions thereof are omitted herein for conciseness.

Referring to FIG. 22, the barrier pattern 230 may not contact an upper surface of the etch stop layer 120, and thus a lower surface of each of the source/drain electrodes 260 and 265 may contact the upper surface of the etch stop layer 120. That is, the barrier pattern 230 of each of the source/drain electrode structure may cover only a sidewall of each of the source/drain electrodes 260 and 265, and may not cover the lower surface of each of the source/drain electrodes 260 and 265.

As illustrated with reference to FIG. 17, during the formation of the barrier pattern 230, when the portion of the barrier layer on the upper surfaces of the division layer 150, the channel 180, the gate insulation pattern 190 and the second sacrificial pattern 200 and the upper surface of the uppermost one of the insulation layers 130 are removed, the portion of the barrier layer on the upper surface of the etch stop layer 120 may be also removed, so that the barrier pattern 230 may not cover the lower surface of each of the source/drain electrodes 260 and 265.

Figure 23:
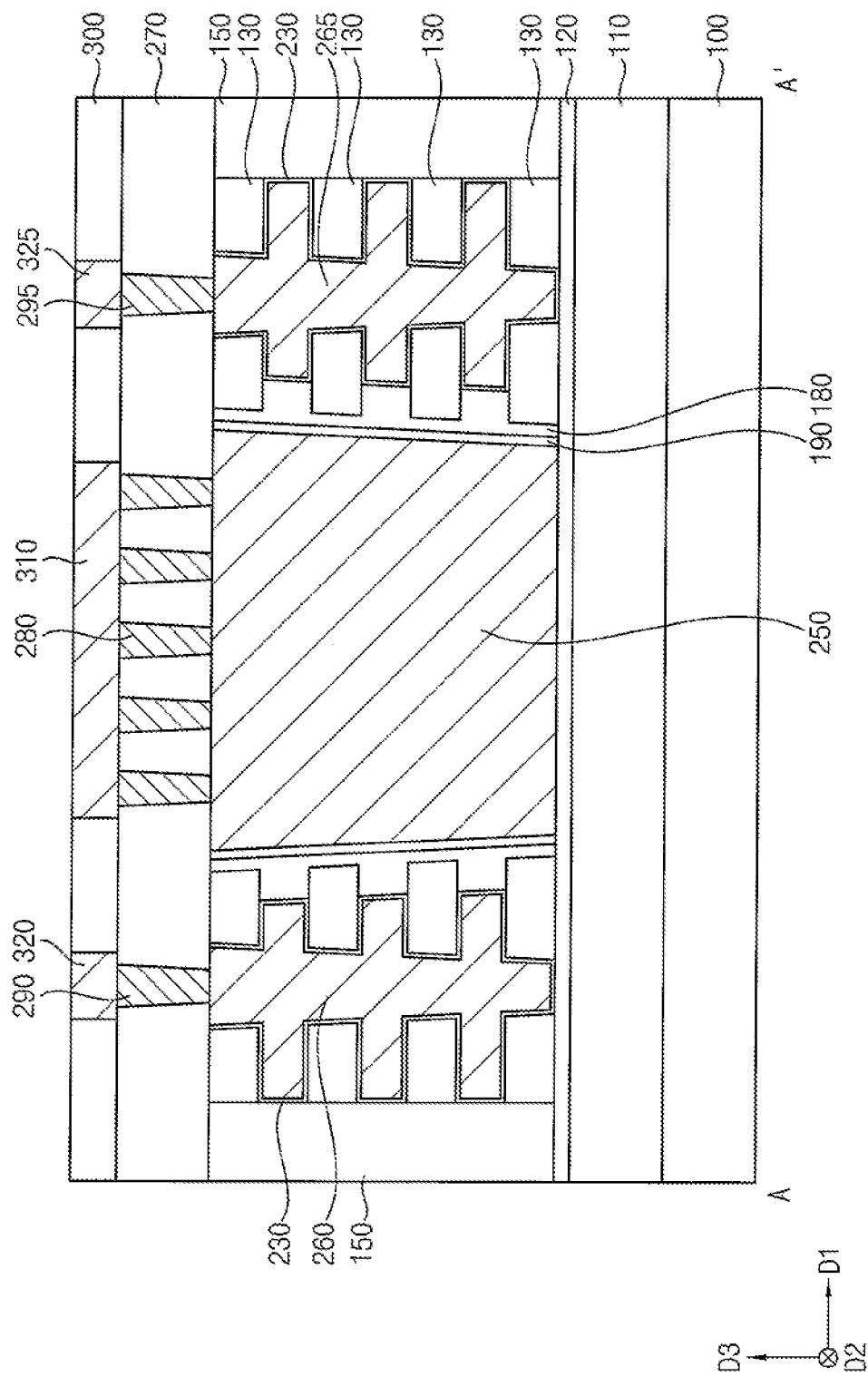
FIG. 23 is a cross-sectional view illustrating a semiconductor device in accordance with example embodiments.

FIG. 23 is a cross-sectional view illustrating a semiconductor device in accordance with example embodiments. The semiconductor device may be substantially the same as or similar to that of FIGS. 1 and 2, except for the gate electrode, the gate insulation pattern and the channel. Thus, like reference numerals refer to like elements, and detailed descriptions thereof are omitted herein for conciseness.

Referring to FIG. 23, the channel 180 and the gate insulation pattern 190 may not be formed on the upper surface of the etch stop layer 120, and thus the lower surface of the gate electrode 250 may contact the upper surface of the etch stop layer 120.

As illustrated with reference to FIGS. 11 and 12, after the channel layer is formed on the etch stop layer 120, the first sacrificial layer 140, the insulation layer 130 and the division layer 150 to fill the first recess 170, and after the gate insulation layer is conformally formed on the channel layer, before the second sacrificial layer is formed to fill the second opening 160, portions of the gate insulation layer and the channel layer on the etch stop layer 120, the uppermost one of the insulation layers 130 and the division layer 150 may be removed, so that the channel 180 and the gate insulation pattern 190 may not be formed on the upper surface of the etch stop layer 120.

Accordingly, the gate insulation layer and the channel layer may be transformed into the gate insulation pattern 190 and the channel 180, respectively, and the second sacrificial layer may be planarized until the uppermost one of the insulation layers 130 and the division layer 150 are exposed to form the second sacrificial pattern 200.

Figure 24:
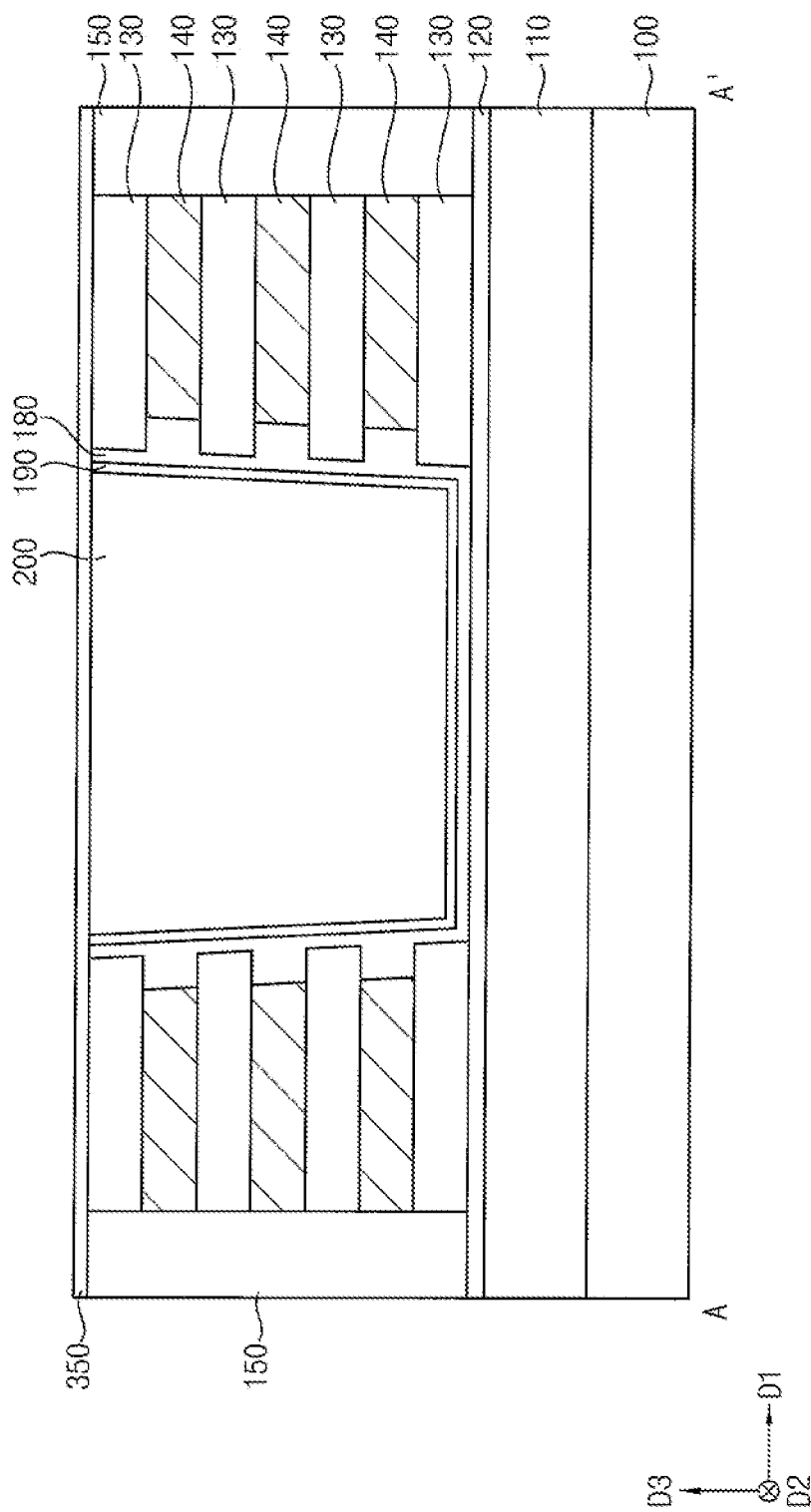
FIGS. 24 and 25 are cross-sectional views illustrating a method of manufacturing a semiconductor device in accordance with example embodiments.
Figure 25:
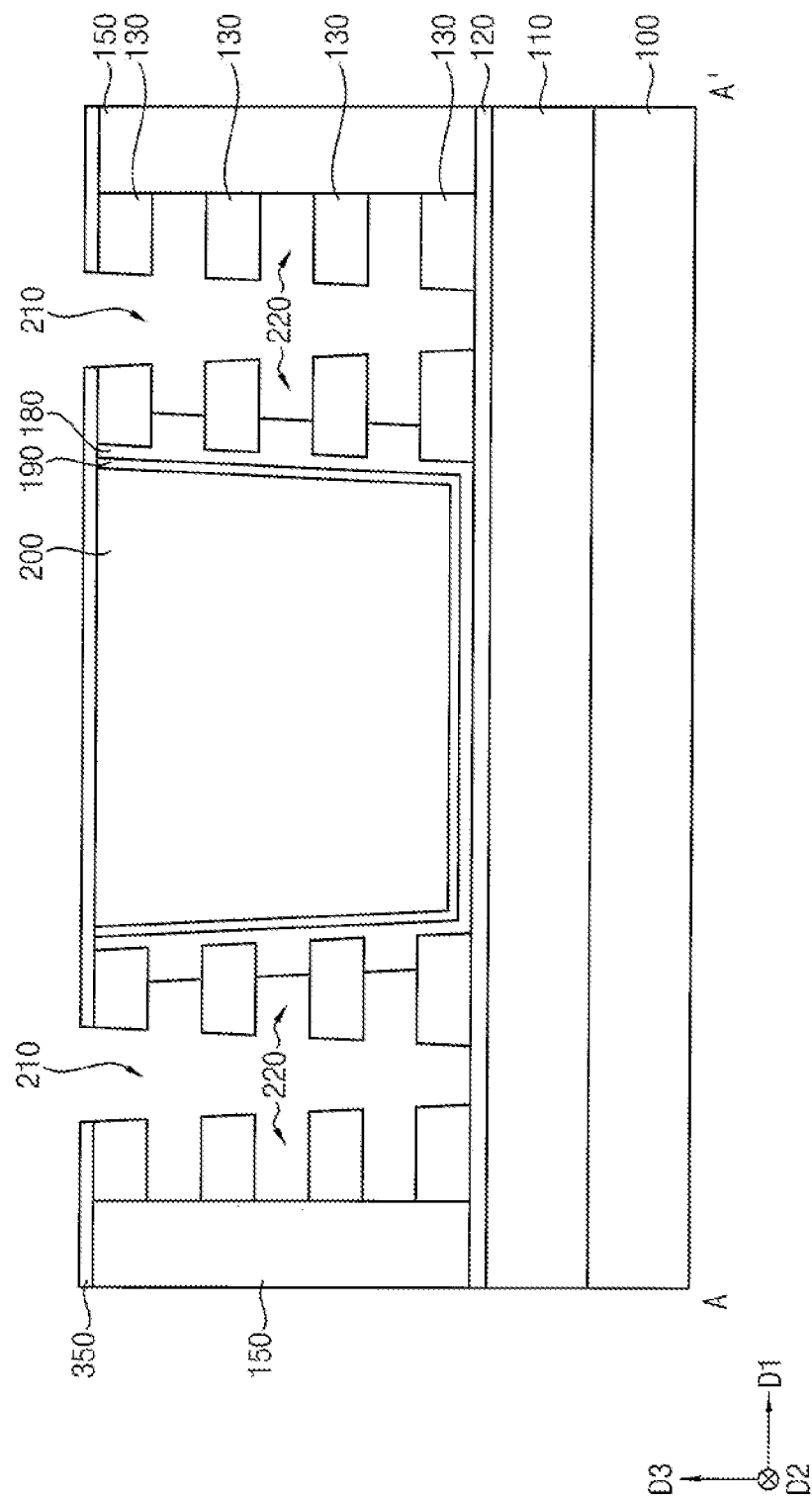

FIGS. 24 and 25 are cross-sectional views illustrating a method of manufacturing a semiconductor device in accordance with example embodiments. This method may include processes substantially the same as or similar to those illustrated with reference to FIGS. 3 to 21 and FIGS. 1 and 2, and thus repeated explanation are omitted herein for conciseness.

Referring to FIG. 24, processes substantially the same as or similar to those illustrated with reference to FIGS. 3 to 12 may be performed, and a capping layer 350 may be formed on the molds, the division layer 150, the channel 180, the gate insulation pattern 190 and the second sacrificial pattern 200.

The capping layer 350 may include a material having an etching selectivity with respect to the first sacrificial layer 140 and the division layer 150, e.g., a metal oxide such as aluminum oxide.

Referring to FIG. 25, processes substantially the same as or similar to those illustrated with reference to FIGS. 13 to 16 may be performed.

Thus, each of the molds may be partially etched to form the third openings 210 exposing the upper surface of the etch stop layer 120, and the first sacrificial layer 140 may be removed through the third openings 210 to form the second recess 220.

As the capping layer 350 including the material having an etching selectivity with respect to the first sacrificial layer 140 and the division layer 150 has been formed on the molds, the division layer 150, the channel 180, the gate insulation pattern 190 and the second sacrificial pattern 200, when the third opening 210 and the second recess 220 are formed, the second sacrificial pattern 200 may be covered by the capping layer 350 not to be removed. Thus, unlike that of FIGS. 11 and 12, the second sacrificial patter 200 may not have an etching selectivity with respect to the first sacrificial layer 140 and may have an etching selectivity with respect to only the insulation layer 130 and the division layer 150. That is, the second sacrificial pattern 200 may include a material having an etching selectivity with respect to the insulation layer 130 and the division layer 150, e.g., polysilicon or silicon nitride.

Processes substantially the same as or similar to those illustrated with reference to FIGS. 17 to 21 and FIGS. 1 and 2 may be performed to complete the fabrication of the semiconductor device.

Figure 26:
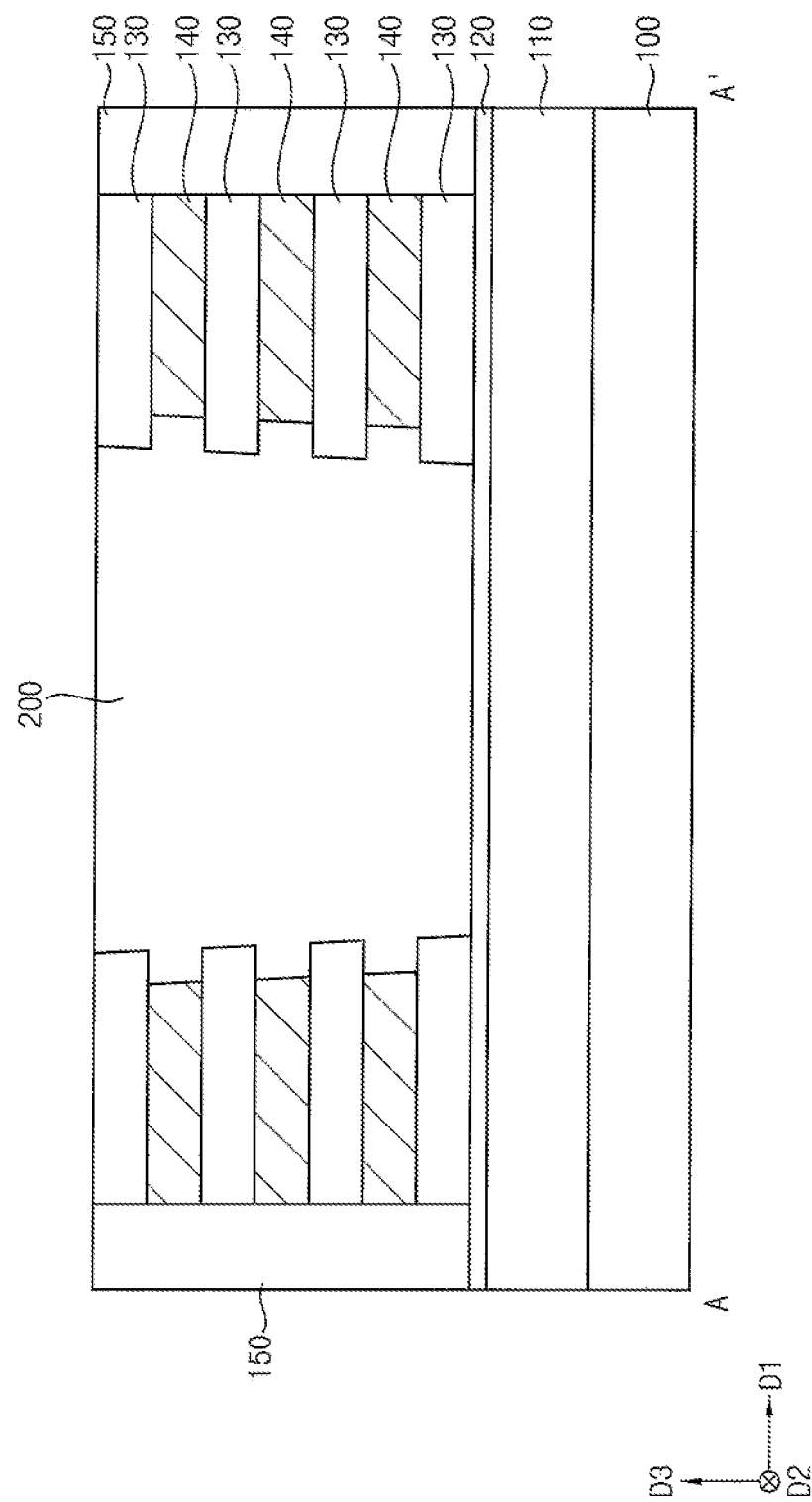
FIGS. 26 to 28 are cross-sectional views illustrating a method of manufacturing a semiconductor device in accordance with example embodiments.
Figure 27:
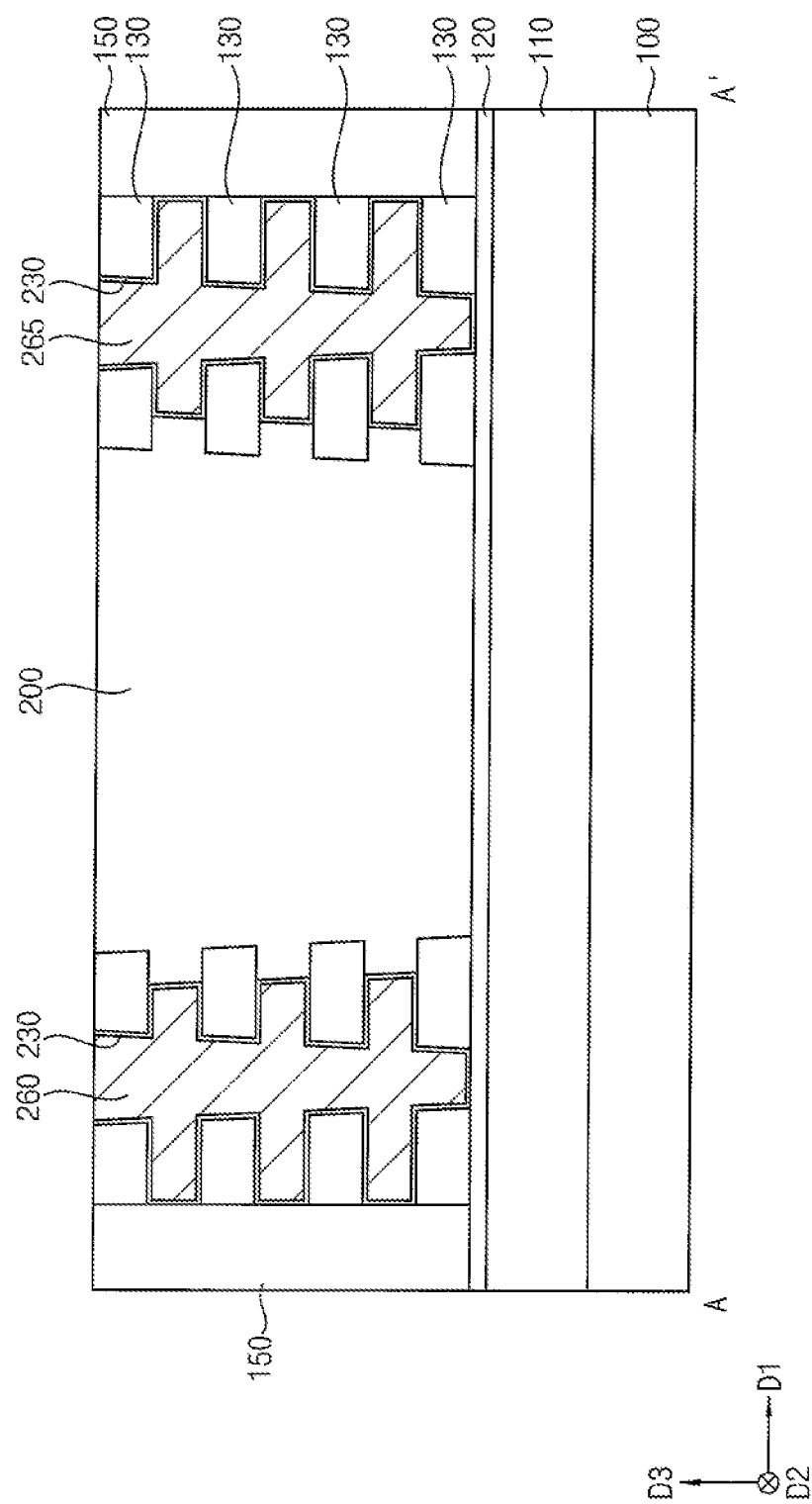
Figure 28:
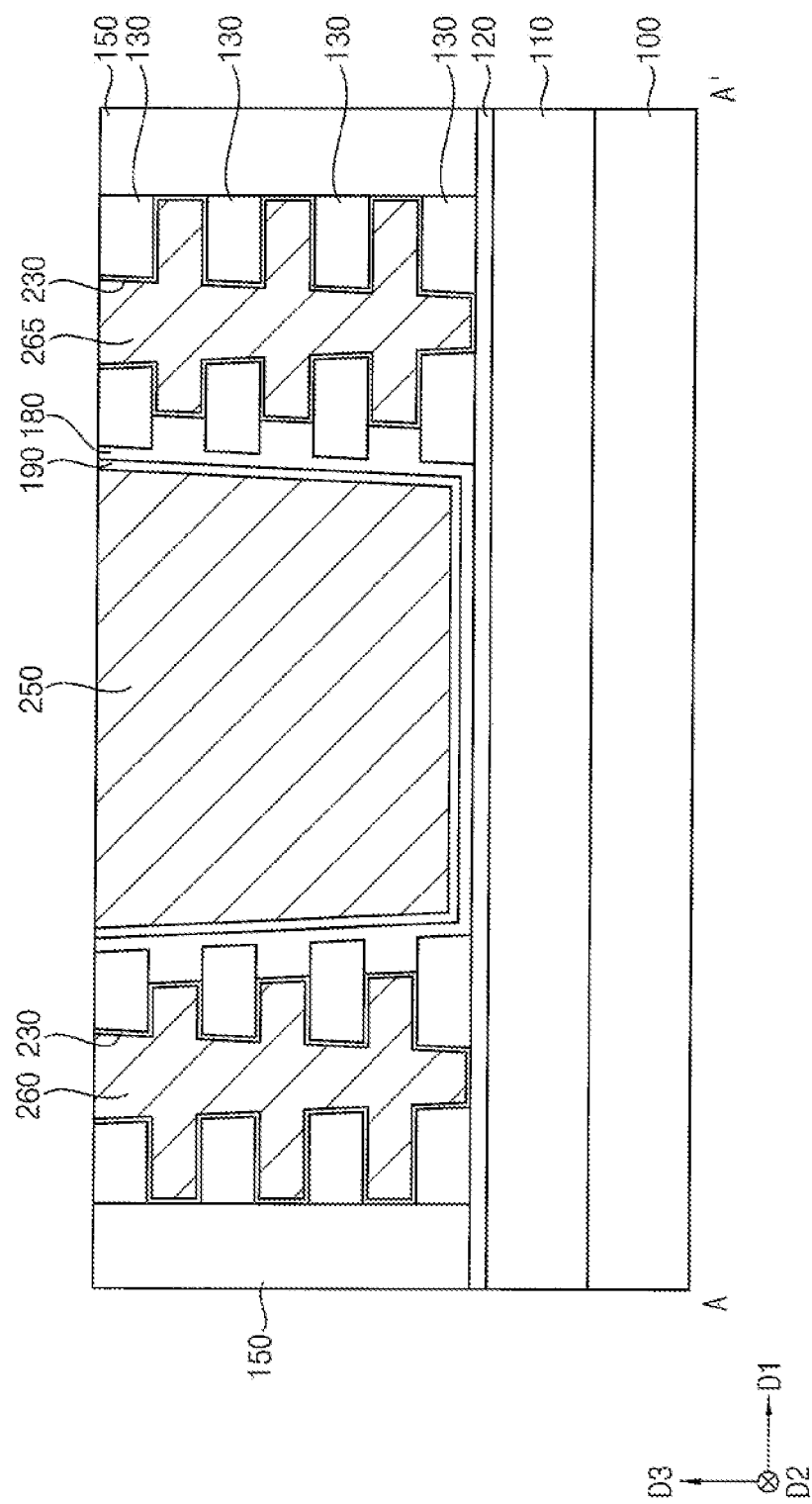

FIGS. 26 to 28 are cross-sectional views illustrating a method of manufacturing a semiconductor device in accordance with example embodiments. This method way include processes substantially the same as or similar to those illustrated with reference to FIGS. 3 to 21 and FIGS. 1 and 2, and thus repeated explanation are omitted herein for conciseness.

Referring to FIG. 26, processes substantially the same as or similar to those illustrated with reference to FIGS. 3 to 10 may be performed, and the second sacrificial pattern 200 may be formed to fill the first recess 170 and the second opening 160.

Referring to FIG. 27, processes substantially the same as or similar to those illustrated with reference to FIGS. 13 to 17 may be performed, so that the third opening 210 and the second recess 220 may be formed in each of the molds and that the barrier pattern 230 may be formed on the upper surface of the etch stop layer 120 and the sidewall and the lower and upper surfaces of each of the insulation layers 130 exposed by the third opening 210 and the second recess 220.

However, after forming the barrier pattern 230, the second sacrificial pattern 200 may not be removed.

Processes substantially the same as or similar to those illustrated with reference to FIGS. 18 and 19 may be performed so that the source/drain electrodes 260 and 265 may be formed on the barrier pattern 230 to fill the third opening 210 and the second recess 220, and the gate electrode 250 may not be formed because the second sacrificial pattern 200 has not been removed.

Referring to FIG. 28, after removing the second sacrificial pattern 200 to form the fourth opening 240, the processes substantially the same as or similar to those illustrated with reference to FIGS. 11 and 12 may be performed so that the channel layer may be formed on the etch stop layer 120, the first sacrificial layer 140, the insulation layer 130 and the division layer 150 to fill the first recess 170 and that the gate insulation layer may be conformally formed on the channel layer.

However, the second sacrificial layer may not be formed on the fourth opening 240, and the conductive layer may be formed on the gate insulation layer to fill the fourth opening 240.

The conductive layer, the gate insulation layer and the channel layer may be planarized until the upper surfaces of the uppermost one of the insulation layers 130 and the division layer 150 are exposed, so that the channel 180 filling the first recess 170 may be formed to contact the sidewalls of the insulation layers 130 and the barrier pattern 230 and the upper surface of the etch stop layer 120, the gate insulation pattern 190 may be formed on the channel 180, and the gate electrode 250 filling the fourth opening 240 may be formed on the gate insulation pattern 190.

In example embodiments, the channel 180 may be formed after forming the barrier pattern 230 and the source/drain electrodes 260 and 265, and thus the characteristics of the channel 180 may not be deteriorated by heat processes for forming the barrier pattern 230 and the source/drain electrodes 260 and 265.

Processes substantially the same as or similar to those illustrated with reference to FIG. 20 and FIGS. 1 and 2 may be performed to complete the fabrication of the semiconductor device.

While example embodiments have been particularly shown and described, it will be understood by one of ordinary skill in the art that variations in form and detail may be made therein without departing from the spirit and scope of the appended claims.

What is claimed is:

1. A semiconductor device comprising:
   a gate electrode on a substrate:
   a channel on the substrate, the channel surrounding sidewalls of the gate electrode; and
   source/drain electrodes on the substrate at opposite sides of the gate electrode in a first direction parallel to an upper surface of the substrate,
   wherein a thickness of the channel from the gate electrode to the source/drain electrodes in a horizontal direction is not constant but varies in a vertical direction, the horizontal direction being parallel to the upper surface of the substrate and the vertical direction being perpendicular to the upper surface of the substrate,
   wherein the gate electrode is one of a plurality of gate electrodes spaced apart from each other in a second direction between the source/drain electrodes, and
   wherein the second direction is parallel to the upper surface of the substrate and perpendicular to the first direction.

2. The semiconductor device of claim 1, wherein the channel includes amorphous silicon, polysilicon, single crystalline silicon, or silicon-germanium.

3. The semiconductor device of claim 1, further comprising a barrier pattern that covers sidewalls of each of the source/drain electrodes,
   wherein the channel contacts the barrier pattern.

4. The semiconductor device of claim 1, wherein the channel is one of a plurality of channels surrounding sidewalls of the plurality of gate electrodes, respectively, and
   wherein the plurality of channels are connected with each other between the plurality of gate electrodes.

5. The semiconductor device of claim 1, wherein the channel includes an oxide semiconductor.

6. The semiconductor device of claim 5, wherein the channel includes barium tin oxide ($BaSnO_3$), zinc oxide (ZnO), laminated lanthanum aluminate/strontium titanate ($LaAlO_3$/$SrTiO_3$), gallium oxide ($Ga_2O_3$), tin oxide ($SnO_2$), indium oxide ($In_2O_3$), indium gallium zinc oxide (IGZO), indium zinc tin oxide (IZTO), indium tin oxide (ITO), indium tungsten tin oxide (IWZO), and/or indium zinc oxide (IZO).

7. The semiconductor device of claim 1, wherein each of the source/drain electrodes includes:
   a vertical portion extending in the vertical direction; and
   a horizontal portion extending from the vertical portion in the horizontal direction, and
   wherein a thickness of a first portion of the channel facing the horizontal portion of each of the source/drain electrodes in the first direction is greater than a thickness of a second portion of the channel facing the vertical portion of each of the source/drain electrodes in the first direction.

8. The semiconductor device of claim 7, wherein the horizontal portion of each of the source/drain electrodes is one of a plurality of horizontal portions spaced apart from each other in the vertical direction, and
   wherein the channel includes a plurality of first portions and a plurality of second portions alternately stacked in the vertical direction.

9. The semiconductor device of claim 8, further comprising an insulation layer between the vertical portion of each of the source/drain electrodes and the plurality of second portions of the channel.

10. The semiconductor device of claim 1, further comprising:
    a first contact plug on the gate electrode; and
    a second contact plug and a third contact plug on the source/drain electrodes, respectively,
    wherein a contact plug distance between the first contact plug and each of the second contact plug and the third contact plug is greater than a minimum distance between the gate electrode and each of the source/drain electrodes.

11. The semiconductor device of claim 10, wherein the first contact plug is one of a plurality of first contact plugs spaced apart from each other in the first direction on the gate electrode,
    wherein the second contact plug is one of a plurality of second contact plugs spaced apart from each other in the second direction on a first one of the source/drain electrodes, and the third contact plug is one of a plurality of third contact plugs spaced apart from each other in the second direction on a second one of the source/drain electrodes,
    the contact plug distance is between an outermost one of the plurality of first contact plugs and each of the second and third contact plugs, and
    wherein the second direction is parallel to the upper surface of the substrate and perpendicular to the first direction.

12. The semiconductor device of claim 11, further comprising:
    a first wiring extending in the first direction and commonly contacting upper surfaces of the plurality of first contact plugs;
    a second wiring extending in the second direction and commonly contacting upper surfaces of the plurality of second contact plugs; and
    a third wiring extending in the second direction and commonly contacting upper surfaces of the plurality of third contact plugs.

13. A semiconductor device comprising:
    a gate electrode on a substrate:
    a channel on the substrate, the channel surrounding sidewalls of the gate electrode; and
    source/drain electrodes on the substrate at opposite sides of the gate electrode in a first direction parallel to an upper surface of the substrate,
    wherein a distance in the first direction between the gate electrode and each of the source/drain electrodes is not constant but varies in a vertical direction perpendicular to the upper surface of the substrate,
    wherein the gate electrode is one of a plurality of gate electrodes spaced apart from each other in a second direction between the source/drain electrodes, and
    wherein the second direction is parallel to the upper surface of the substrate and perpendicular to the first direction.

14. The semiconductor device of claim 13, further comprising:
    a first contact plug on the gate electrode; and
    second and third contact plugs on the source/drain electrodes, respectively,
    wherein a distance in the first direction between the first contact plug and each of the second and third contact plugs is greater than a minimum distance in the first direction between the gate electrode and each of the source/drain electrodes.

15. The semiconductor device of claim 13, wherein each of the source/drain electrodes includes:

a vertical portion extending in the vertical direction; and
a horizontal portion extending from the vertical portion in a horizontal direction parallel to the upper surface of the substrate, and wherein a distance in the first direction between the gate electrode and the vertical portion of each of the source/drain electrodes is greater than a distance in the first direction between the gate electrode and the horizontal portion of each of the source/drain electrodes.

16. The semiconductor device of claim 15, wherein the horizontal portion of each of the source/drain electrodes is one of a plurality of horizontal portions spaced apart from each other in the vertical direction, and wherein the distance in the first direction between the gate electrode and each of the source/drain electrodes increases and decreases periodically.

17. The semiconductor device of claim 15, wherein the channel includes a plurality of first portions and a plurality of second portions alternately stacked in the vertical direction, each of the plurality of first portions having a relatively large thickness in the horizontal direction and each of the plurality of second portions having a relatively small thickness in the horizontal direction.

18. The semiconductor device of claim 17, wherein each of the plurality of first portions faces the horizontal portion of each of the source/drain electrodes in the first direction, and each of the plurality of second portions faces the vertical portion of each of the source/drain electrodes in the first direction.

19. A semiconductor device comprising:
a gate electrode on a substrate:
a channel on the substrate, the channel surrounding sidewalls of the gate electrode;
source/drain electrodes on the substrate at opposite sides of the gate electrode in a first direction parallel to an upper surface of the substrate;
a first contact plug on the gate electrode;
second and third contact plugs on the source/drain electrodes, respectively; and
first to third wirings contacting upper surfaces of the first to third contact plugs, respectively,
wherein a thickness of the channel between the gate electrode and the source/drain electrodes in a horizontal direction is not constant but varies in a vertical direction and a thickness of each of the source/drain electrodes in the horizontal direction is not constant but varies in the vertical direction, the horizontal direction being parallel to the upper surface of the substrate and the vertical direction being perpendicular to the upper surface of the substrate, and
wherein a distance in the horizontal direction between the first contact plug and each of the second and third contact plugs is greater than a minimum distance in the horizontal direction between the gate electrode and each of the source/drain electrodes.

* * * * *